(12) United States Patent
Irie

(10) Patent No.: US 7,001,674 B2
(45) Date of Patent: Feb. 21, 2006

(54) EXPOSURE METHOD, EXPOSURE APPARATUS, AND METHOD OF PRODUCTION OF DEVICE

(75) Inventor: Nobuyuki Irie, Kumagaya (JP)

(73) Assignee: Nikon Corporation, Tokyo (JP)

( * ) Notice: Subject to any disclaimer, the term of this patent is extended or adjusted under 35 U.S.C. 154(b) by 199 days.

(21) Appl. No.: 10/430,312

(22) Filed: May 7, 2003

(65) Prior Publication Data

US 2003/0211410 A1 Nov. 13, 2003

(30) Foreign Application Priority Data

May 8, 2002 (JP) .............................. 2002-132998
Apr. 4, 2003 (JP) .............................. 2003-101133

(51) Int. Cl.
*B32B 15/01* (2006.01)
*F03B 3/12* (2006.01)

(52) U.S. Cl. ...................... 428/679; 428/678; 428/680; 416/241 R

(58) Field of Classification Search ................. 430/22, 430/30; 355/53, 67, 77
See application file for complete search history.

(56) References Cited

U.S. PATENT DOCUMENTS 6,341,007 B1 1/2002 Nishi et al. .................... 355/53
2003/0152851 A1 * 8/2003 Ikeda .......................... 430/30

FOREIGN PATENT DOCUMENTS

EP 1 164 437 A2 12/2001
JP A 10-163098 6/1998

* cited by examiner

*Primary Examiner*—Christopher G. Young
(74) *Attorney, Agent, or Firm*—Oliff & Berridge PLC

(57) ABSTRACT

An exposure method for preventing accumulation of process error for substrates processed by an apparatus designed for multiprocessing and producing high quality semiconductor chips. A semiconductor integrated circuit production line polishes wafers of individual lots at a first processing system and second processing system of a CMP system two at a time. Wafer processing information indicating at which processing system of the first processing system and second processing system each wafer has been processed is transmitted through a communication line to a later processing apparatus including an exposure apparatus. The wafers of a lot loaded in the exposure apparatus are allocated to a plurality of processing systems of the exposure apparatus so that wafers processed by the same processing system are processed by the same processing system among the two processing systems of the exposure apparatus and are exposed at those processing systems.

30 Claims, 9 Drawing Sheets

FIG. 8
LITHOGRAPHY APPARATUS
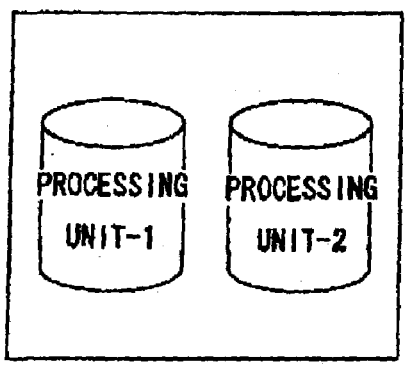
RESIST COATER/DEVELOPER
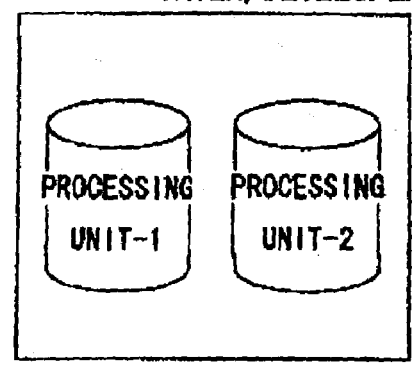
ETCHING APPARATUS
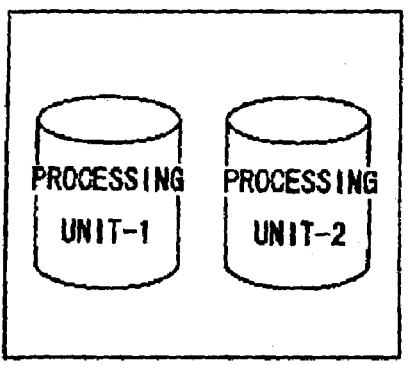
DOPING APPARATUS
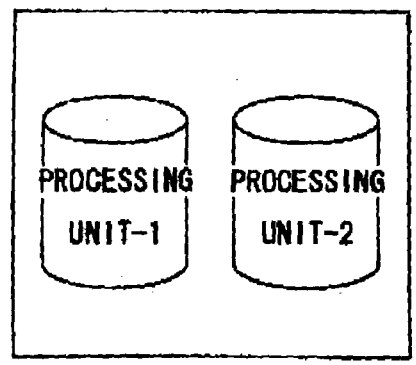
DEPOSITION APPARATUS
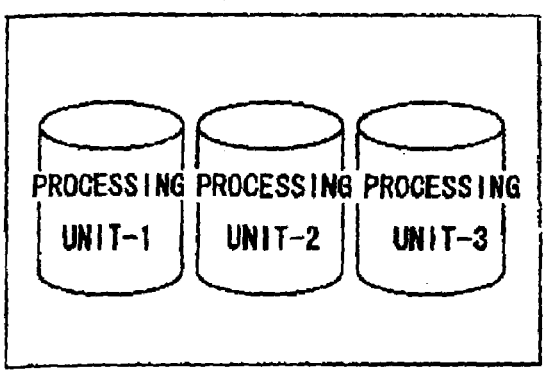
CMP APPARATUS
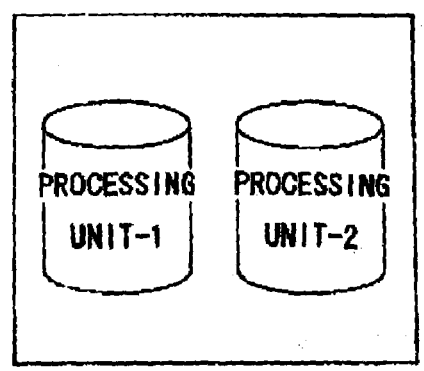

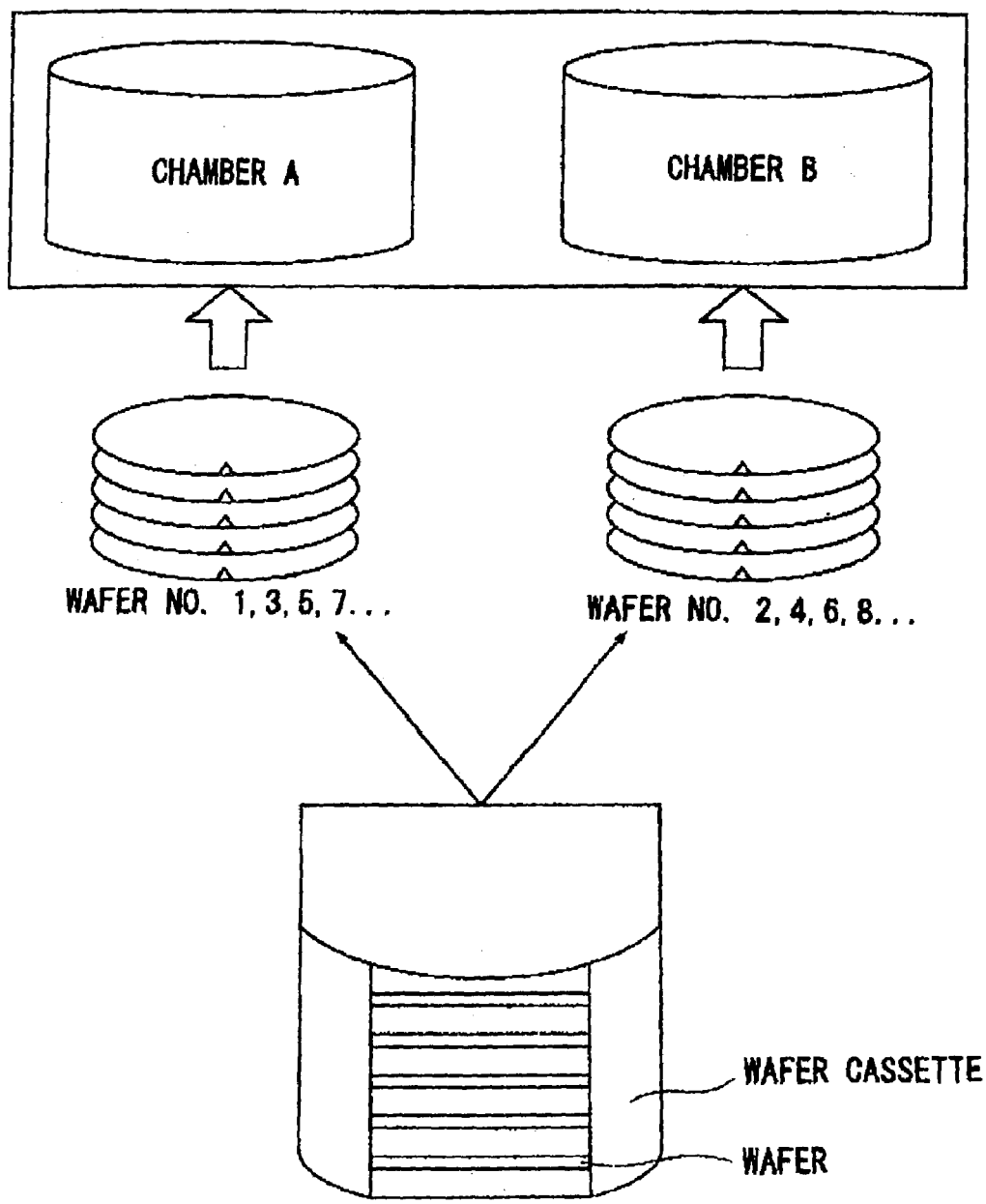

EXPOSURE METHOD, EXPOSURE APPARATUS, AND METHOD OF PRODUCTION OF DEVICE

BACKGROUND OF THE INVENTION

1. Field of the Invention

The present invention relates to an exposure method and exposure apparatus for producing a semiconductor integrated circuit, a liquid crystal display element, a thin film magnetic head, or another micro device or other semiconductor chip, a photomask, a reticle, etc. using photolithography, more particularly relates to an exposure method using an exposure apparatus able to perform processing in parallel on a plurality of wafers or other substrates, an exposure apparatus for the same, and a method of production of a device using such an exposure method and exposure apparatus.

2. Description of the Related Art

In the process of production of a wafer when producing a semiconductor integrated circuit etc., a desired circuit is formed on a silicon or other wafer by repetition of processing such as oxidation, thin film formation, doping, resist processing, exposure, etching, cleaning, chemical mechanical polishing (CMP), etc. Further, in the process of fabrication of a mask, a desired pattern is formed on a glass substrate or other substrate by similar processing such an resist processing, exposure, etching, etc.

When mass producing a semiconductor chip produced through such a process, the processing capability of how may wafers and substrates can be processed in a certain time at each step, that is, the throughput, in extremely important. Raising this is desirable.

To deal with such demands for higher throughput, recent processing apparatuses have been provided with a plurality of processing units for multiprocessing performing part or all of the processing simultaneously in parallel. For example, as shown in FIG. 8, various lithography systems for multifabrication, etching systems, resist coaters, resist developers, doping systems, CMP systems, etc. provided with two processing units have been commercialized. Further, film forming systems provided with three processing units have also been commercialized.

An example of multiprocessing in a processing apparatus having a plurality of processing units is shown schematically in FIG. 9.

As shown in FIG. 9, if loading a wafer cassette in a processing apparatus having two chambers for simultaneous processing, a wafer loader successively takes out wafers from the cassette and allocates them to the two chambers A and B. At that time, in a processing apparatus having two chambers, usually wafers of odd numbered and even numbered positions from one end in the wafer cassette are respectively loaded and processed in the same chambers. Further, after being subjected to predetermined processing in the same chambers, the wafers are again set in the wafer cassette and transported to the next step.

In a processing apparatus designed for multiprocessing, high speed processing is realized by processing a plurality of wafers or substrates simultaneously in parallel or providing a plurality of chambers and thereby shortening the wafer conveyance time.

As a projection exposure apparatus used in such a wafer processing step or mask fabrication step and transferring a pattern of a photomask or reticle on a wafer or glass substrate or other substrate coated with a photosensitive material (sometimes called a "sensitive substrate"), wide use is made of a step-and-repeat type reduction projection exposure apparatus (so-called "stepper") or a step-and-scan type scan exposure apparatus. In recent years, in such exposure apparatuses as well, apparatuses provided with a plurality of substrate stages and improved in throughput have been proposed.

For example, Japanese Unexamined Patent Publication (Kokai) No. 10-163098 of the same assignee and U.S. Pat. No. 6,341,007 corresponding to the Japanese Patent Publication disclose a projection exposure apparatus having a plurality of a substrate stages controlled so that the two substrate stages do not contact each other and controlled so that the operation of one stage does not have any effect on the operation of the other stage.

In such a processing apparatus designed for multiprocessing which performs processing in a plurality of chambers etc., sometimes each chamber, that is, each processing system, has different process error.

For example, a CMP system having two chambers is provided with two pads for polishing wafers. Sometimes, the degree of polishing changed slightly with each pad and two types of process error occurred in the polished wafers. Further, in such a CMP system, in quite a few cases, the directions of rotation of the pads for polishing in the chambers are made clockwise and counterclockwise due to the ease of such a mechanical structure. As a result, sometimes two types of process error occur.

When performing exposure by a conventional exposure apparatus for processing all wafers by the same wafer stage and alignment apparatus after such processing, there was the problem that the overlay accuracy at the time of exposure fell. Further, in such a case, in the final analysis, only practical processing to try to reduce the process error itself in the prior step was possible. Effective countermeasures were not taken.

On the other hand, in recently proposed exposure apparatuses provided with two substrate stages an explained above, the exposure apparatus itself generated process error corresponding to the number of the processing systems, that is, process error of the two substrate stages themselves like other processing apparatuses designed for multiprocessing. Therefore, the situation had arisen that when such an exposure apparatus processed wafers etc. after processing by such an apparatus designed for multiprocessing, wafers having two typos of process error were exposed by an exposure apparatus having a further two types of process error, so the process error grew ad therefore the overlay accuracy greatly deteriorated.

SUMMARY OF THE INVENTION

An object of the present invention is to provide a method of exposure by exposure apparatus designed for multiprocessing having a plurality of substrate stages or other processing systems, in particular a method of exposure able to prevent accumulation of process error and extreme deterioration in the overlay accuracy when exposing a substrate being processed after processing by a processing apparatus designed for multiprocessing and thereby produce high quality semiconductor chips with a high throughput.

Another object of the present invention is to provide an exposure method and apparatus able to reduce the effect of process error and enable a high accuracy design pattern to be formed on sensitive substrates when exposing a plurality of sensitive substrates using a plurality of substrate stages.

Still another object of the present invention is to provide an exposure apparatus designed for multiprocessing having a plurality of substrate stages or other processing systems, in particular an exposure apparatus designed to be able to prevent accumulation of process error and extreme deterioration in the overlay accuracy when exposing a substrate being processed after processing by a processing apparatus designed for multiprocessing and thereby produce high quality semiconductor chips with a high throughput.

Still another object of the present invention is to provide an exposure method and apparatus able to accurately detect positional information of a plurality of substrates passing through a processing apparatus performing the same processing by a plurality of processing systems.

Still another object of the present invention is to provide an exposure method and apparatus able to reduce the effect of process error and form a high accuracy device pattern for a plurality of substrates passing through a processing apparatus performing the same processing by a plurality of processing systems.

Still another object of the present invention is to provide a method of production of a device able to produce a micro device with a high accuracy and high throughput.

To achieve the above objects, according to a first aspect of the present invention, there is provided a method for exposing a sensitive substrate by an exposure apparatus having a plurality of processing systems and transferring a pattern on a mask to the sensitive substrate, wherein, when exposing a series of sensitive substrates subjected to predetermined processing by a processing apparatus having a plurality of processing systems before exposure, the series of sensitive substrates are allocated to and exposed at the plurality of processing systems of the exposure apparatus so that the sensitive substrates processed by the same processing system of the processing apparatus at the time of the previous processing are processed at the same processing system of the plurality of processing systems of the exposure apparatus.

According to this exposure method, a series of sensitive substrates processed by a processing apparatus designed for multiprocessing having a plurality of processing systems and therefore suffering from process error of a plurality of systems are allocated to and exposed at the same processing system of the exposure apparatus for each processing system processed at, in other words, for each process error. That is, the sensitive substrates processed at any one processing system of the plurality of processing systems are exposed at one processing system of the plurality of processing systems in the exposure apparatus as well. Therefore, a series of sensitive substrates with various process error are prevented from being subjected to processing whereby the process error will further grow. Even when exposing sensitive substrates processed by a processing apparatus designed for multiprocessing, accumulation of process error can be prevented and suitable exposure is possible with an overlay accuracy similar to that of the past.

Preferably, in the exposure method according to the present invention, the exposure apparatus has a plurality of substrate stages, and sensitive substrates processed by the same processing system of the processing apparatus are loaded and exposed at the same substrate stage of the plurality of substrate stages.

More preferably, in the exposure method according to the present invention, the exposure apparatus has a plurality of alignment sensors, and sensitive substrates processed by the same processing system of the processing apparatus are aligned using the same alignment sensor among the plurality of alignment sensors and exposed.

More preferably, in the exposure method according to the present invention, the exposure apparatus has an alignment unit for alignment using one of a plurality of alignment offsets, an alignment offset is set to sensitive substrate processed by the same processing system of the processing apparatus, and the sensitive substrates processed by the same processing system are aligned using the alignment offset.

According to these exposure methods, alignment offsets are set for each processing system of the processing apparatus, in other words, for each process error; sensitive substrates are placed on the same substrate stage, using the same alignment sensor, or combining the same for each processing system of the processing system; and further growing of process error can be prevented.

Further, the exposure method according to the present invention acquires information identifying the sensitive substrates processed by the same processing system of the processing apparatus by receiving information regarding the series of sensitive substrates for the exposure transmitted from the previous processing apparatus, a host computer managing the process of production of the semiconductor chips overall, or other external apparatus or based on the storage positions of the sensitive substrates at a cassette storing the sensitive substrates and allocates them based on the information.

Further, as a preferred specific example, the exposure method according to the present invention is one in which the exposure apparatus has a first and second processing system such as being provided with two alignment offsets, substrate stages, or alignment sensors as mentioned above, which alternately allocates and exposes the series of sensitive substrates processed at the plurality of processing systems of the processing apparatus and stored in a cassette to the first processing system and the second processing system so that the sensitive substrates processed at the same processing system in the processing apparatus are processed at the same processing system of the exposure apparatus.

Further, the exposure method according to the present invention is an exposure method for successively exposing a plurality of sensitive substrates by an ensure apparatus having a first substrate stage and second substrate stage, comprising loading each of the plurality of sensitive substrates at either of the first and second substrate stages based on information showing the processing history of the plurality of sensitive substrates.

According to an exposure method of the present invention, even when exposing a plurality of sensitive substrates using an exposure apparatus having a plurality of substrate stages, the growth in process error etc. is reduced and a desired device pattern can be formed on each possible substrate.

Further, the method of production of a device according to the present invention includes the step of transferring a device pattern on the sensitive substrates using any of the above exposure methods.

Further, to achieve the above objects, according to a second aspect of the present invention, the exposure apparatus of the present invention is an exposure apparatus having a substrate stage on which a sensitive substrate to be exposed is placed, an offset setting unit which determines an alignment offset for alignment of a sensitive substrate placed on the substrate stage, an alignment unit which performs an alignment process of a sensitive substrate placed on the substrate stage using the determined offset, and an exposing unit which exposes an aligned sensitive substrate, wherein a plurality of processing systems each provided with at least one of the substrate stage, the offset setting unit, and the alignment unit are provided, and an allocating unit which allocates a series of sensitive substrates processed by a processing apparatus having a plurality of processing systems before the exposure, so that, the sensitive substrates processed by the same processing system of the processing apparatus are processed at the sue processing system in the plurality of processing systems of the exposure apparatus.

In the exposure apparatus of this configuration, the series of sensitive substrates processed by a processing apparatus designed for multiprocessing having a plurality of processing systems and therefore suffering from process error corresponding to the plurality of processing systems are allocated to the same processing system among the plurality of processing systems of exposure apparatus for each processing system processed at, in other words, for each process error. Note that each of the plurality of processing systems includes at least one of a substrate stage on which the sensitive substrate is carried, an offset setting unit which determines an alignment offset for alignment of the sensitive substrate carried on the substrate stage, or an alignment unit which performs an alignment procedure using the offset for the sensitive substrate carried on the substrate stage.

Further, due to the plurality of processing systems, sensitive substrates having the same process are aligned and exposed, by using the same alignment offset, the same substrate stages, use the same alignment unit, or by using combinations of the same.

Therefore, the sensitive substrates processed by any one processing system among the plurality of processing systems are processed by one processing system among the plurality of processing systems in part or all of the processing in the exposure apparatus. Therefore, the situation where a series of sensitive substrates with various process error are processed in a manner causing the process error to further grow is extremely reduced or avoided. Even when exposing sensitive substrates processed by a processing apparatus designed for multiprocessing, it is possible to prevent accumulation of process error and suitably perform exposure by an overlay accuracy similar to that of the past.

Further, the exposure apparatus according to the present invention has a plurality of offset setting unit for setting alignment offsets, the allocating unit allocates sensitive substrates processed by the same processing system of the processing apparatus to any of the plurality of offset setting unit set with alignment offsets corresponding to the processing systems, and the alignment unit aligns the series of sensitive substrates using alignment offsets set in the offset setting unit to which the sensitive substrates are allocated.

Further, preferably, the exposure apparatus according to the present invention has a plurality of substrate stages, and the allocating unit allocates sensitive substrates processed by the same processing system of the processing apparatus to the same substrate stage of the plurality of substrate stages.

Further, preferably, the exposure apparatus according to the present invention has a plurality of alignment unit having alignment sensors, the allocating unit allocates sensitive substrates processed by the same processing system of the processing apparatus to the same alignment unit of the plurality of alignment unit.

Further, as a specific preferred example, the exposure apparatus according to the present invention further has a substrate processing information acquiring unit which acquires information showing the sensitive substrates processed by the same processing system of the processing apparatus, and the allocating unit allocates substrates based on the acquired information.

Preferably, the substrate processing information acquiring unit has a communicating unit and acquires the information.

More preferably, the substrate processing information acquiring unit acquires the information by identifying the processing system in the processing apparatus based on storage positions of the sensitive substrates in a cassette storing the series of sensitive substrates.

Further, as a specific preferred example, the exposure apparatus according to the present invention has first and second processing systems each having at least one of the substrate stage, the offset setting unit, and the alignment unit, and the allocating unit alternately allocates the series of sensitive substrates processed at the plurality of processing systems of the processing apparatus and stored in a cassette to the first processing system and the second processing system so that sensitive substrates processed by the same processing system of the processing apparatus are processed by the same processing system of the exposure apparatus.

Further, to achieve the above objects, according to a third aspect of the present invention, there is provided an exposure apparatus for transferring a pattern of a mask to a series of sensitive substrates conveyed through a processing apparatus performing the same processing at a plurality of processing systems, having an alignment system which includes a plurality of first mark detection systems, and which detects marks of the sensitive substrates arranged at different positions and a setting apparatus which sets processing routines for the series of sensitive substrates so that marks of sensitive substrates processed by the same processing system of the processing apparatus are detected by the same first mark detection system of the alignment system before transfer of the pattern.

According to this, in the sensitive substrates processed by one processing system of the processing apparatus, since marks are detected by the same mark detection system in the exposure apparatus, even if processing sensitive substrates by a plurality of processing systems of a processing apparatus, the process error will no longer grow, positional information of marks of sensitive substrate can be detected with a good accuracy using the first mark detection systems, and the pattern of a mask can be transferred to sensitive substrates with a good accuracy.

Further, there need be only one movable body for holding the sensitive substrates (substrate stage), but preferably the exposure apparatus according to the present invention further has a plurality of movable bodies for holding the sensitive substrates, holds sensitive substrates processed by the same processing system of the processing apparatus by the same movable body, transfers the pattern to sensitive substrates held by a first movable body among the plurality of movable bodies, and, substantially in parallel, detects marks of sensitive substrates held by a second movable body by one of the plurality of first mark detection systems.

Further, the sensitive substrates may be transferred to and from the plurality of movable bodies at the same position, but preferably the exposure apparatus according to the present invention further has a transport system for transporting the sensitive substrates between a first position to which sensitive substrates processed b the processing apparatus are conveyed (for example, position of entry of sensitive substrates loaded from the processing apparatus into the exposure apparatus when the exposure apparatus and processing apparatus are connected in-line) and a plurality of second positions where the sensitive substrates are transferred with the plurality of movable bodies, sensitive substrates processed by the same processing system of the processing apparatus being transported by the same path (that is, through the same second positions).

Further, preferably, the exposure apparatus according to the present invention further has a plurality of first interferometer systems, provided corresponding to the plurality of first mark detection systems, for detecting positional information of the sensitive substrates during detection of marks of the sensitive substrates by the mark detection system and a second interferometer system for detecting positional information of the sensitive substrates during transfer of the pattern to the sensitive substrates.

Further, preferably, the exposure apparatus according to the present invention further has a second mark detection system, having a detection center set in a coordinate system defined by the second interferometer system, for detecting marks of the sensitive substrate or a movable body holding the sensitive substrates and uses the second interferometer system to control movement of the movable body and transfer the pattern to the sensitive substrates based on detection results of the first and second mark detection systems.

Further, the exposure apparatus according to the present invention is an exposure apparatus for transferring a pattern of a mask to a series of sensitive substrates conveyed through a processing apparatus having a first processing system and second processing system performing the same processing, the apparatus having a storage apparatus for storing a first offset corresponding to the first processing apparatus and a second offset corresponding to the second processing apparatus and a processing mechanism for processing substrates processed by the first processing system among the series of sensitive substrates using the first offset and processing substrates processed by the second processing system using the second offset.

According to the exposure apparatus of the present invention, a series of sensitive substrates conveyed through a processing apparatus having a first processing system and a second processing system performing the same processing is processed using offset information corresponding to the processing systems, so a predetermined pattern can similarly be transferred accurately to all sensitive substrates.

Further, the method of production of a device according to the present invention includes the step of transferring a device pattern to a sensitive substrate using an exposure apparatus of any of the above claims. More preferably, in the method of production of a device according to the present invention, the exposure apparatus has a plurality of separate processing systems (developers etc.) for performing the same processing on sensitive substrates to which the device pattern is transferred and processes sensitive substrates passing through the same path in the exposure apparatus by the same separate processing system of the processing apparatus.

Note that the unit for solving the problems are described in this section with reference to components shown in the attached drawings, but these are just for facilitating understanding and are not given to limit the unit according to the present invention.

BRIEF DESCRIPTION OF THE DRAWINGS

These and other objects and features of the present invention will become clearer from the following description of the preferred embodiments given with reference to the attached drawings, wherein:

FIG. 8 is a view of an example of a production apparatus designed for multiprocessing in a semiconductor integrated circuit production line, and FIG. 9 is a view of the state of a plurality of wafers being processed simultaneously in parallel in the processing apparatus designed for multiprocessing shown in FIG. 8.

DESCRIPTION OF THE PREFERRED EMBODIMENTS

An embodiment of the present invention will be explained first with reference to FIG. 1 to FIG. 5.

In the present embodiment, the present invention will be explained illustrating part of the process of wafer processing in a production line of semiconductor integrated circuits.

Figure 1:
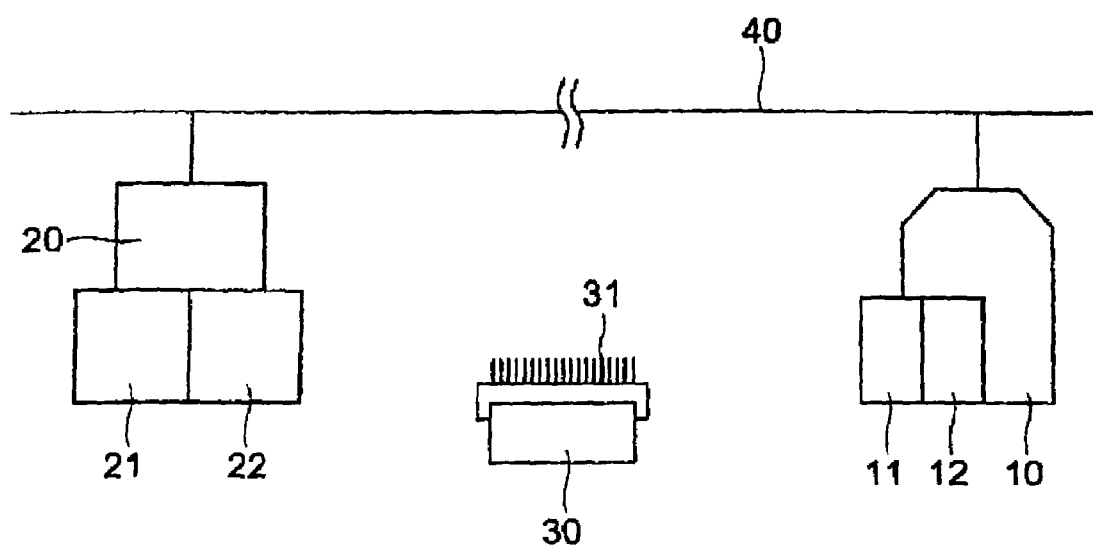
FIG. 1 is a view schematically showing the configuration of a semiconductor integrated circuit production line according to an embodiment of the present invention.

FIG. 1 is a view schematically showing part of the production line.

The semiconductor integrated circuit production line 1 has an exposure apparatus 10, a wafer processing apparatus 20, and a communications line 40.

First, the general configuration of the semiconductor integrated circuit production line 1 will be explained.

The exposure apparatus 10 is an apparatus for transferring a pattern drawn on a reticle serving as a mask through a projection optical system on to a wafer coated with a photosensitizing material (sensitive substrate). In the prevent embodiment, it is a step-and-scan type projection exposure apparatus.

The exposure apparatus 10 is an apparatus designed for multiprocessing and provided with two wafer stages, three alignment sensors (first mark detection systems 152 and 153 and second mark detection system 151) and a configuration able to set respective alignment offsets corresponding to the alignment sensors. Further, in the exposure apparatus 10, the two wafer stages, alignment sensors and alignment offsets are functionary combined, respectively, and substantially form two processing systems 11 and 12. By performing parts of the processing in parallel in the two processing systems 11 and 12, processing is streamlined.

Therefore, wafers 31 stored in a wafer cassette 30 are successively loaded at one of the two wafer stages where they are aligned using one of the alignment sensors and alignment offsets and successively exposed.

At that time, the exposure apparatus 10 allocates the wafers based on the information showing the processing history of the wafers input through the communications line 40 from the wafer processing apparatus 20, that is, determines the allocation for each of the wafers as to which of the two wafer stages to load it on and which of the alignment processing systems to use to align it. Further, in particular, the exposure apparatus 10 allocates wafers so that wafers processed by the same processing system of the wafer processing apparatus 20 are processed by the same processing system, that is, carried on the same wafer stage and aligned by the same alignment system.

The wafer processing apparatus 20 performs any wafer processing performed before exposure in the process of processing wafers in a production line of semiconductor integrated circuits. In particular, it enables wafers to be processed simultaneously in parallel by two processing systems 21 and 22.

Specifically, the wafer processing apparatus 20 is for example an etching system, an evaporation system, a CVD system, a sputtering system, or other film forming system, a resist coater, a developer, a baking unit oven, a resist peeling system, or other resist processing system, a doping system, a diffusion system, an ion implanter, or other doping system or CMP system or other system.

Note that in the present embodiment, the wafer processing apparatus 20 is a CMP system.

The CMP system 20 has two chambers and is designed for multiprocessing able to perform CMP processing simultaneously in parallel on two wafers. That is, the CMP system 20 carries wafers to be polished in two chambers and performs polishing simultaneously by two polishing pads.

Further, in the CMP system 20, the two polishing pads are rotated clockwise and counterclockwise due to the mechanical configuration. Therefore, the process error of the wafers polished in the CMP system 20 shows specific tendencies corresponding to the left and right chambers. In other words, the wafers polished by the CMP system 20 include wafers having process error corresponding to the left chamber and wafers having process error corresponding to the right chamber. Therefore, the CMP system 20 transmits information showing at which chamber each of the wafers in the same lot is processed, in other words, information showing the system of the process error of each of the wafers, through the communication lines 40 to the exposure apparatus 10 or other later processing apparatus.

Further, the wafers polished by the CMP system 20 are introduced in lots to the next process, for example, are formed with films, coated with resists, etc., then introduced to the exposure step using the exposure apparatus 10. Here, however, to facilitate the explanation, the explanation of the film formation, resist coating, etc. is omitted and the explanation made of the processing when wafers processed by the CMP system 20 are introduced to the next exposure step for exposure.

The communications line 40 in a transmission channel for transfer of desired information among the processing apparatuses on a production line of the semiconductor integrated circuits. By communication among the apparatuses on the production line and overall management apparatus etc. through this communications line 40, wafer processing information of each lot is transmitted and grasped, the state of processing of lots in the processing apparatuses is grasped, and production in controlled based on the grasped information and processing state.

In the present embodiment, processing information of the wafers in the CMP system 20, that is, information on which chamber of the CMP system 20 each of the wafers in a lot is processed at, is transmitted to the exposure apparatus 10 of the CMP system 20 through the communications line 40.

Next, the configuration of the exposure apparatus 10 according to the present invention will be explained in detail with reference to FIG. 2.

Figure 2:
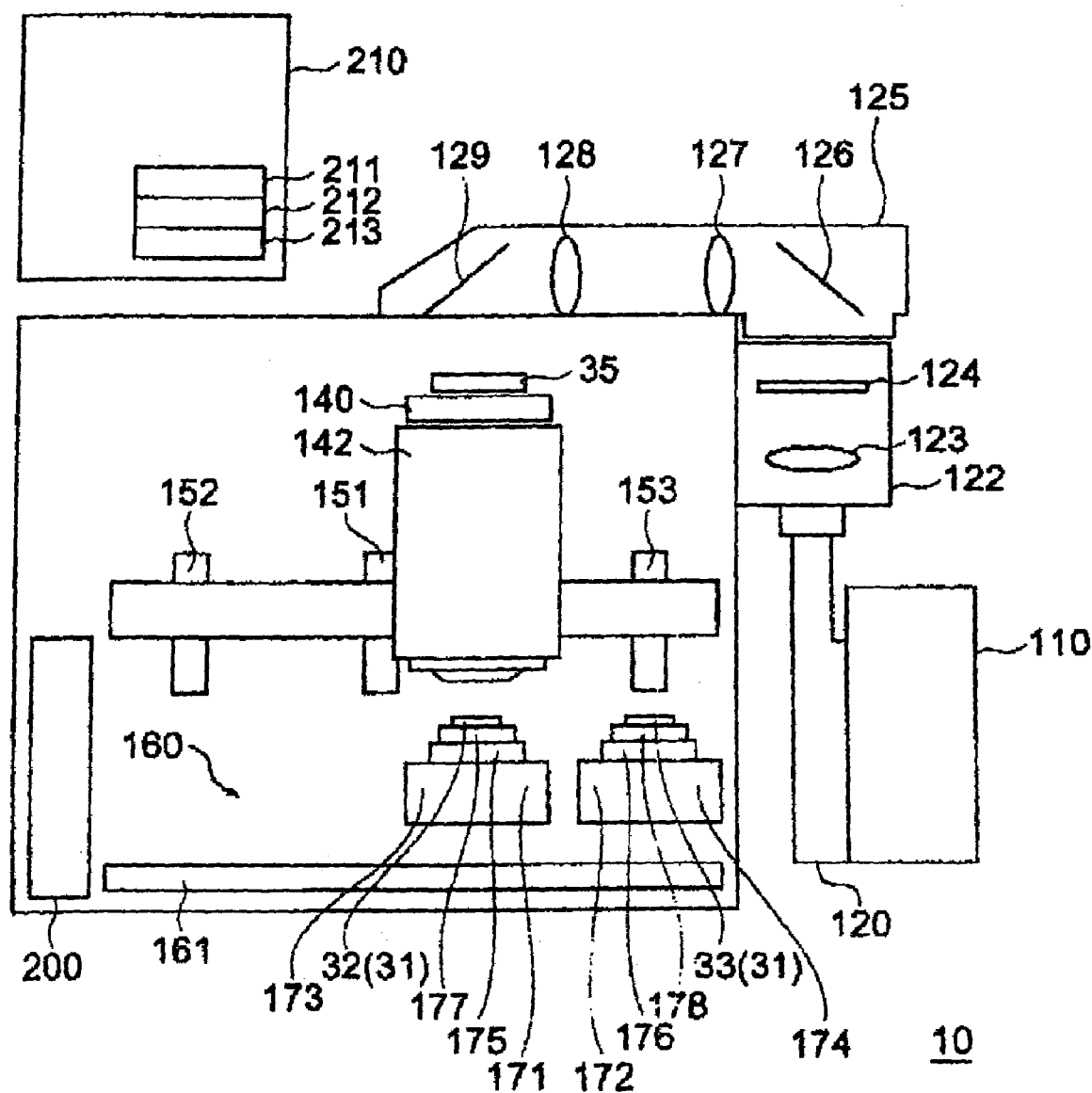
FIG. 2 is a view showing the configuration of an exposure apparatus according to the present invention used for a semiconductor integrated circuit production line shown in FIG. 1.

FIG. 2 is a view of the configuration of an exposure apparatus 10 of the present embodiment.

The exposure apparatus 10 has a light source 110, a beam matching unit 120, illumination optical systems 122 and 125, a reticle stage 140, a projection optical system 142, first to third alignment sensors 151 to 153, a stage apparatus 160, a wafer loader 200, and a control system 210.

Note that below the direction orthogonal to the optical axis of the projection optical system 142 and perpendicular to the paper surface is defined as the "X-direction", the direction orthogonal to the X-direction and parallel to the paper surface the "Y-direction", and the direction orthogonal to the X- and Y-directions and parallel to the optical axis of the projection optic system 142 the "Z-direction".

First, the light source 110 to the projection optical system 142 will be explained.

For example, ultraviolet pulse light or other light generated at an ArF excimer laser or other flight source 110 is introduced to the illumination optical systems (122 and 125) through a beam matching unit 120 (BMU) for matching the position of the ultraviolet light pulses with respect to the optical axis of the illumination optical system by movable mirrors etc.

The illumination optical system emit ultraviolet light pulses (exposure light) passing through the BMU 120 to the reticle 35. For example, the illumination optical system changes the illumination conditions of the reticle (that is, the distribution of amount of exposure light on the pupil planes of the illumination optical systems) in accordance with the pattern to be transferred to the wafer, restricts the illumination area of the reticle 35 illuminated by the exposure light to a rectangle centered on the optical axis and extending in the X-direction in the circular field of the projection optical system 142, and varies the width of the illumination area relating to the scan direction (in the present embodiment, the Y-direction) over which the reticle 35 is moved during the scan exposure.

Here, the illumination optical system in the present embodiment comprises of a first optical system 122 provided on a separate frame from the column on which the main exposure system including the later-mentioned projection optical system 142 is supported and a second optical system 125 provided on the column. The first optical system 122 has a variable light attenuator, a beam shaping optical system 123, an optical unit for changing the above mentioned illumination conditions (for example, including at least one prism able to move along the optical axis of the illumination optical system, a zoom optical system, and a plurality of diffraction optical systems arranged exchangeably in the illumination optical system), an optical integrator, a beam splitter, a reticle blind (masking blind) 124 defining the above-mentioned illumination area, etc. and shapes the exposure light emitted from the BMU 120 and makes the illumination uniform. Further, the second optical system 125 has a mirror 126, condenser lens system 127, imaging lens system 128, mirror 129, etc. and emits exposure light from the first optical system 122 to illuminate a reticle 35 held on the reticle stage 140 by a uniform illumination intensity. Note that below, the first and second optical systems will be called the "illumination optical system 122 and 125".

Note that a not shown beam splitter provided at each of the illumination optical systems 122 and 125 has a high transmittance and low reflectance. Light reflected from there enters to a not shown integrator sensor where the amount of light is measured. Based on the amount of light measured and the transmittance or reflectance of the beam splitter stored in advance, a later mentioned control system 210 detects and controls the amount of light entering the projection optical system and further the amount of light on a substrate.

The reticle stage 140 in provided above the projection optical system 142, holds a photomask formed with a transfer pattern, that is, a reticle 35, can move in the Y-direction by a predetermined stroke, and can finely move the reticle 35 in the XY plane in the rotational direction and translational direction and adjust its posture. Further, the reticle stage 140 moves the reticle 35 with respect to the exposure light (illumination area) at a predetermined speed in the scan direction (Y-direction) at the time of scan exposure. While not shown, an interferometer system having at least six measurement axes measures the positional information of the reticle stage 140 (reticle 35) in the X-, Y-directions, the three amounts of rotation about the X-axis, Y-axis, and Z-axis (pitching, rolling, and yawing), and the positional information in the Z-direction (distance from projection optical system 142).

Note that the reticle stage 140 moves and adjusts the reticle 35 in posture in synchronization with movement of the wafer being exposed in the stage apparatus 160 based on a control signal from the control system 210.

The projection optical system 142 is a double-sided telecentric reduction system forming a reduced image of a pattern of a reticle 35 on an exposure area (illumination area of exposure light on wafer 31) conjugate with the above-mentioned illumination area. Therefore, the image of the pattern of the reticle 35 is reduced by a predetermined reduction power by the projection optical system 142 and projected on a wafer 31 coated with a photoresist on its surface in advance carried on the first wafer stage 171 or second wafer stage 172 of the stage apparatus 160.

Next, the stage apparatus 160 will be explained.

The stage apparatus 160 has first and second wafer stages (movable bodies) 171 ad 172 able to move independently over a base plate 161 in two-dimensional directions and a stage drive system (not shown) driving these wafer stages using later explained first and second interferometer systems based on control signals from the control system 210.

The first and second wafer stages 171 and 172, as shown in FIG. 2, has stage bodies 173 and 174, ZL stages 175 and 176, and wafer holders 177 and 178 holding wafers 31.

The stage bodies 173 and 174 are bases for holding the ZL stages 175 and 186 an wafer holders 177 and 178 etc. and are supported on a base plate 161 while floating above it by not shown air bearings. Specifically, the bottom surfaces of the stage bodies 173 and 174 are provide with for example vacuum pressure type air bearings or other air pads at a plurality of locations. By the balance between the air ejection force and vacuum pressure of the air pads, the first and second wafer stages 171 and 172 overall are supported above the base plate 161 by floating by several microns.

Further, the stage bodies 173 and 174 are supported by engagement with second linear guides 183 and 184 of the stage drive system by the later mentioned magnets 189 and 190 and are moved along the second linear guides 183 and 184 by a linear motor comprised by the magnets 189 and 190 and the second linear guides 183 and 184.

The ZL stages 175 and 186 are placed on the stage bodies 173 and 174 and carry the wafer holders on their top surfaces. The ZL stages 175 and 176 are placed on the stage bodies 173 and 174 by being supported at three points by three not shown Z-direction actuators. By being driven by the Z-direction actuators, they are moved by fine distances in the Z-direction and adjusted in inclination with respect to the XY plane.

The wafer holders 177 and 178 hold the wafers 31 coated on their surfaces with photoresists, respectively. The wafer holders 177 and 178 hold by suction the wafers 31 conveyed by the wafer loader 200, and carried on the surfaces of the wafer holders 177 and 178 so as not to move in position by the action of the vacuum suction force from not shown suction holes formed in the surfaces of the wafer holders 177 and 178.

Figure 3:
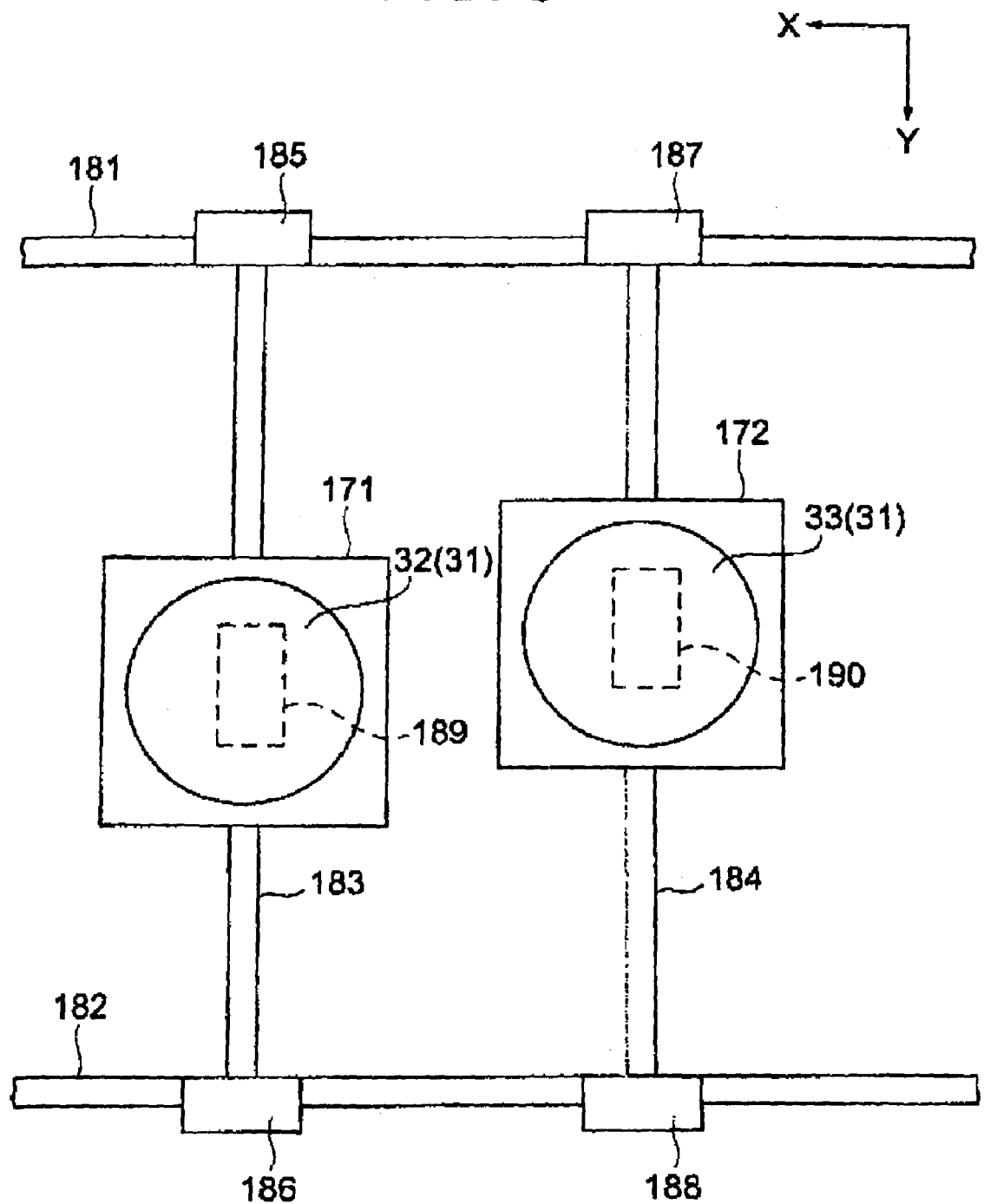
FIG. 3 is a view of the configuration of a stage drive system of the exposure apparatus shown in FIG. 2.

The stage drive system, as shown in FIG. 3, has first linear guides 181 and 182, second liner guides 183 and 184, drive coils 185, 186 and 187, 188, and magnets 189 and 190 provided at the bottom surfaces of the first and second wafer stages 171 and 172.

The first linear guides 181 and 182 have stationary magnets of the linear motor extended in a first direction (X-axial direction in the present embodiment). The first and second wafer stages 171 and 172 on the base plate 161 move between the first linear guides 181 and 182.

Further, the second linear guides 183 and 184 have magnets of the linear motor extended in a second direction (Y-axial direction in the present embodiment) perpendicular to the first direction having portions intersecting the first linear guide as two ends. The two ends of the second linear guides 183 and 184 are provided with drive coils 185, 186 and 187, 188. The drive coils 185, 186 and 187, 188 and the first linear guides 181 and 182 form linear motors. Further, the drive coils 185, 186 and 187, 188 move in parallel on the first linear guides 181, 182, whereby the second linear guides 183, 184 are moved in the direction of the first linear guides 181, 182, that is, the X-direction.

Further, by changing somewhat the torques of the pairs of drive coils 185, 186 and 187, 188 provided at the two sides of the second linear guides 183, 184, it is possible to generate or remove a fine yawing at the first and second wafer stages 171, 172, Further, the second linear guides 183, 184 are provided with first and second wafer stages 171, 172 by magnets 189, 190 provided at the bottom surfaces. Further, the magnets 189 and 190 and the second linear guides 183 and 184 from a linear motor. Due to this, the first and second wafer stages 171 and 172 are moved in the direction of the second linear guides 183 and 184, that is, the Y-direction.

Note that while not shown, the exposure apparatus 10 of FIG. 2 is provided with two first interferometer systems for detecting positional information of the first and second wafer stages 171 and 172 (wafer 31) respectively under the second and third alignment systems 152 and 153 among the first to third alignment systems (alignment sensors) 151 to 153, and a second interferometer system for detecting positional information of the first wafer stage 171 or second wafer stage 172 (wafer 31) under the projection optical system 142. The two first interferometer systems and the second interferometer system each have five measurement axes, emit laser beams to the reflection surfaces formed at the ZL stages 177 and 178, and measure the X-, Y-direction positional information of the wafer stage and three amounts of rotation about the X-axis, Y-axis, and Z-axis (pitching, rolling, and yawing).

Note that one of the two first interferometer systems detects the positional information of the first stage 171 at the time of detection of the alignment marks of wafers 31 and fiducial marks provided at the first wafer stage 171 etc. by the second alignment system 152, and the other first interferometer system detects positional information of the second stage 172 at the time of detection of the alignment marks of wafers 31 and fiducial provided at the second wafer stage 172 etc. by the third alignment system 153. Further, the second interferometer system detects positional information of the wafer stage 171 (or 172) at the time of exposure of the wafers 31 by exposure light through the reticle 35 and projection optical system 142 (that is, transfer of pattern of reticle 35 to the wafer 31), at the time of detection of the fiducial marks of the wafer stage 171 (or 172) by the first alignment system 151, etc.

Next, the first to third alignment systems 151 to 153 provided at the exposure apparatus 10 of FIG. 2 will be explained.

The first alignment system 131 has a detection center in a Cartesian coordinate system (hereinafter also called the "exposure coordinate system") defined by the above second interferometer system and is able to detect the alignment marks of the wafers 31, the fiducial marks provided at the wafer stages 171 and 172, etc. The results of detection are sent together with the measured values of the second interferometer system to the control system 210 where the positional information (coordinate values) of the marks are found. The first alignment system 151 in the present embodiment is an off axis system. The positional relationship between the detection center of the first alignment system 151 and the optical axis of the projection optical system 142 (projection center of pattern image of reticle 35), the so-called base line amount, is measured in advance and stored in the control system 210. Note that the first alignment system 151 is preferably not an off axis system requiring base line management, but a through-the-reticle (TTR) system detecting alignment marks of the reticle 35 and fiducial marks of the wafer stage (or alignment marks of the wafers 31) through the projection optical system 142. In the TTR system, it is also possible to use fiducial marks provided at the reticle stage 140 instead of alignment marks of the reticle 35.

Further, the second alignment system 152 has a detection center in a Cartesian coordinate system (hereinafter also referred to as the alignment coordinate system) defined by the above one first interferometer system and detects the alignment marks of the wafer 31, the fiducial marks provided at the first wafer stage 171, etc. The results of detection are sent together with the measured values of the one first interferometer system to the control system 210 where the positional information (coordinate values) of the marks are found. The marks are detected by the second alignment system 152 substantially parallel to the transfer of the pattern of the reticle 35 to the wafers 31 held on for example the second wafer stage 172.

Further, the third alignment system 153 ham a detection center in a Cartesian coordinate system (alignment coordinate system) defined by the above other first interferometer system and detects the alignment marks of the wafer 31, the fiducial marks provided at the second wafer stage 172, etc. The results of detection are sent together with the measured values of the other first interferometer system to the control systems 210 where the positional information (coordinate values) of the marks are found. The marks are detected by the third alignment system 153 substantially parallel to the transfer of tho pattern of the reticle 35 to the wafers 31 held on for example the first wafer stage 171.

Here, the control system 210 uses the offset values corresponding to the alignment sensors stored in the first to third offset storage units 211 to 213 and processes the detection signals of the alignment sensors to find the positional information of the alignment marks or fiducial marks. Further, the first to third alignment systems in the present embodiment irradiate marks by broad band light generated from halogen lamps etc., detect the marks by pickup elements (CCD), perform waveform processing on the image signals obtained, and detect the positional information. Note that the first to third alignment systems 151 to 153 are not limited to image processing system and may also be other systems, for example, systems emitting coherent beams to the marks substantially perpendicularly and causing interference between and detecting the two diffraction beams of the same order generated from the marks. Further, the exposure apparatus 10 of the present invention has two processing systems 11 and 12. Each processing system comprises an alignment system (152 or 153), wafer stage (171 or 172), and one of the first interferometer systems.

Next, the wafer loader 200 will be explained.

The wafer loader 200 is a conveyance mechanism (transport system) for transporting wafers between a wafer cassette 30 and the first and second wafer stages 171 and 172 based on the control signals from the control system 210. In the present embodiment, the wafers processed by the processing apparatus (CMP system) 20 are stored in the wafer cassette 30 in lot units and the wafer cassette 30 is loaded into the exposure apparatus 10 by a worker etc., so the first position where the wafers processed by the processing apparatus 20 in the exposure apparatus 10 are loaded becomes the position where the wafer cassette 30 in set. Further, in the present embodiment, the second positions (wafer load/unload position) where the wafers are transferred (exchanged) between the wafer loader 200 and first and second wafer stages 171 and 172 were arranged to different positions between the first wafer eta 171 and second wafer stage 172. Note that the wafer cassette 30 is preferably a sealed type where entry of impurities in prevented.

Note that it is also possible to make the wafer load/unload position the same for the first and second wafer stages 171 and 172.

Specifically, the wafer loader 200 takes out the wafers 31 instructed by the control system 210 from the wafer cassette 30, conveys the to either wafer stage of the first wafer stage 171 or second wafer stage 172 instructed by the control system 210, and places then on the wafer holders. Further, it retrieves the wafers 31 finished being exposed from the first and second wafer stages 171 and 172 and stores them at predetermined positions of a new wafer cassette instructed from the control system 210.

Finally, the control system 210 will be explained.

The control system 210 controls the parts of the exposure apparatus 10 so as to suitably expose the wafers 31 introduced.

Specifically, first, the control system 210 determines the allocation of each of the wafers 31 in a lot introduced to the exposure apparatus 10 to the two wafer stages 171 and 172, and controls the actual loading of the wafers 31 to the wafer stages based on the determined allocation.

The control system 210 receives, from the CMP system 20 through the communications line 40, information showing which of the two processing systems 21 and 22 of the CMP system 20 each of the wafers 31 of the same lot in processed at. The control system 210 stores this information in the control system 210 and refers to it when a corresponding lot is introduced into the exposure apparatus 10 so as to identify the wafers processed by the same processing system in the CMP system 20. Further, the control system 210 allocates the wafers 31 to the two wafer stages 171 and 172 so that wafers processed in the same processing system in the CMP system 20 are exposed at the same processing system of the first wafer stage 171 or the second wafer stage 172 in the exposure apparatus 10.

The results of the allocation are realized by the control system 210 controlling the wafer loader 200 to actually place the wafers on either the first wafer stage 171 or the second wafer stage 172. Further, the first wafer stage 171 and the second wafer stage 172 are alternately moved to the wafer load/unload positions separately defined on the base plate 161 by the stage drive systems, and alternately performs a load/unload operation. Therefore, the control system 210 controls the wafer loader 200 so as to alternately take out the wafers 31 to be allocated to the first wafer stage 171 and second wafer stage 172 from the wafer cassette 30 and alternately load than in the first wafer stage 171 and second wafer stage 172.

Further, the control system 210 refers to the offset values corresponding to the alignment sensors stored in advance in the first to third offset storage units 211 to 213 in order to perform predetermined signal processing base an the signals detected by the alignment sensors of the first to third alignment systems 151 to 153 and detects positions of the fiducial marks of the first wafer stage 171 or second wafer stage 172 or alignment marks etc. on the wafers 32 and 33 held on these wafer stages.

Further, the control system 210 detects the positions of the wafer stages 171 and 172 and the wafers 32 and 33 based on the positions of the detected fiducial marks and alignment marks et.

Further, the control system 210 controls the stage drive system based on the positions of the first and second wafer stages 171 and 172 and the wafers 32 and 33 detected an explained above and controls the positions of the first wafer stage 171 and second wafer stage 172 and the positions of the wafers 32 and 33.

That is, the control system 210 in the exposure apparatus 10 of FIG. 2 controls the movement of the first and second wafer stages 171 and 172 through the stage drive system so that the first wafer stage 71 is moved to one of the above-mentioned two wafer load/unload positions, the alignment position where marks are detected by the second alignment system 152, and the exposure position where the pattern of the reticle 35 is transferred (in the present example, including the alignment position where marks are detected by the first alignment system 151) and so that the second wafer stage 172 is moved to the other wafer load/unload position, the alignment position whore marks are detected by the third alignment system 153, and the above-mentioned ensure position.

Finally, the control system 210 controls the drive coils 185, 186 and 187, 188 engaged with the first linear guides 181 and 182 and forming the linear motors so as to control the positions of the second linear guides 183 and 184 defining the positions in the X-direction of the first wafer stage 171 and second wafer stage 172. Further, the control system 210 controls the magnets 189 and 190 engaged with the second linear guides 183 and 184 and forming the linear motors so as to control the positions of the first wafer stage 171 and second wafer state 172 in the Y-direction.

Due to this, the first wafer stage 171 and second wafer stage 172 are alternately arranged at the exposure position, and movements of the wafer stages are controlled by the exposure apparatus in accordance with the measured values of the second interferometer system. Further, one of the first and second wafer stages 171 and 172 holding the wafer finished being exposed is moved from the exposure position to the wafer load/unload position where the wafer is exchanged (exposed wafer is unloaded and wafer to be exposed is loaded). In parallel with thin, the other wafer stage is moved from the alignment position to the exposure position where positional information is measured by a second interferometer system 151. Fiducial marks provided at the other wafer stage are detected by the first alignment system 151 and then the wafer starts to be exposed (reticle pattern transferred). Further, the one wafer stage on which a wafer to be exposed in loaded is moved from the wafer load/unload position to the alignment position where it is measured for positional information by the first interferometer system. Alignment marks of the wafer and fiducial marks provided at the one wafer stage are detected by one of the second and third alignment systems (152 or 153) substantially in parallel with the exposure of the wafer held at the other wafer stage. Further, the other wafer stage is moved to the wafer load/unload position after the end of exposure, while the one wafer stage is moved from the alignment position to the exposure position. After this, the above operation is repeated until all of the wafers in the same lot (in this example, the cassette 30) finish being exposed.

Further, the control system 210 detects the amount of light entering the projection optical system and the amount of light on the substrate based on the amount of light reflected at the beam splitter detected at the integrated sensor of the illumination optical system 122 and the transmittance or reflectance of the beam splitter stored in advance. Further, based on the detection results, it controls the light source 110 to start and stop the emission of light, controls the oscillation frequency and the output pulse energy, in order to adjust the amount of exposure for the resist an the wafer 31.

Further, the control system 210 drives the reticle stage 140 and wafer stage (171 or 172) by a speed ratio corresponding to the magnification power of the projection optical system 142 through the stage drive system so as to move the wafer 31 at a predetermined speed relative to the exposure light (exposure area) emitted from the projection optical system 142 in synchronization with the movement of the reticle 35 at a predetermined speed relative to the exposure light (illumination area) emitted from the illumination optical system during scan exposure. Further, the control system 210 reduces the synchronization error between the reticle 35 and the wafer 31 during the scan exposure using at least one of the reticle 140 and wafer stage, in the present embodiment by rotating the reticle 35 slightly in the XY plane and moving it translationally to adjust its posture.

Next, the operation of the semiconductor integrated circuit production line 1 of this configuration will be explained.

First, when the wafers 31 of a lot introduced to the semiconductor integrated circuit production line 1 are supplied to the CMP system 20 designed for multiprocessing, the CMP system 20 simultaneously polishes two wafers in parallel by the two processing systems 21 and 22. That is, it sets the wafers in the two chambers and simultaneously polishes them by polishing pads provided corresponding to the chambers.

When the two wafers finish being polished, the CMP system 20 picks up the wafer from the chambers and stores them at predetermined positions of the wafer cassette 30. In the present embodiment, the wafers processed by the first processing system 21 and the wafers processed by the second processing system 22 are stored in that order from one end of the wafer cassette 30.

Next, the CMP system 20 successively polishes two wafers of the lot at a time and stores the polished wafers successively in the wafer cassette 30 in the similar order. As a result, finally, the wafer cassette 30 stores wafers processed by the two processing systems 21 and 22 in the state alternately arranged from one end.

The wafers 31 of the lot finished being processed by CMP in this way are conveyed by for example a worker or stacked on an automated guided vehicle (AGV) etc. and automatically conveyed to the processing apparatus of the next step where for example a film forming process or resist coating process is performed. Note that the explanation of these processes will be omitted.

Further, wafers 31 passing through these processes are similarly conveyed by a worker to be introduced to the exposure step or stacked on an AGV etc. and automatically conveyed to the exposure apparatus 10.

On the other hand, the information of the processing by the two processing systems 21 and 22 explained above in the CMP system 20 is transmitted through a communications line 40 to the later processing apparatus including the exposure apparatus 10, a management apparatus for managing the semiconductor integrated circuit production line 1 as a whole, etc. Specifically, information (information regarding processing history) including information on which of the two processing systems 21 and 22 of the CMP system 20 each wafer of the lot in processed at is transmitted to the processing apparatus including the exposure apparatus 10 from the CMP system 20.

The exposure apparatus 10 receives the information of processing in the CMP system 20 and stores it is the control system 210.

The wafer cassette 30 storing the wafers 31 conveyed to the exposure apparatus 10 and processed at the CMP system 20 is set in the exposure apparatus 10 in a state enabling the stored wafers 31 to be taken out by the wafer loader 200.

Further, the control system 210 of the exposure apparatus 10 reads out the information of the processing at the CMP system 20 of each wafer 31 of that lot stored previously and identifies which of the two processing systems 21 and 22 of the CMP system 20 each wafer 31 is processed at.

Further, based on the results, the control system 210 then controls the wafer loader 200 so that the wafers 31 processed at the first processing system 21 of the CMP system 20 are loaded an the first wafer stage 171 and the wafers 31 processed at the second processing stage 22 of the CMP system 20 are loaded on the second wafer stage 172.

Further, according to this control by the control system 210, first, the wafer loader 200 takes out the wafer 31 (32) processed by the first processing system 21 of the CMP system 20 stored at one and of the wafer cassette 30, conveys it to the first wafer stage 171 moved to a not shown wafer load/unload position, and places it on the wafer holder 177. The carried wafer 32 is held firmly on the wafer holder 177 by the vacuum auction holding force acting on the wafer holder 177.

Here, a large number of shot areas on the wafer 32 held on the first wafer stage 171 are formed with marks for fine alignment (hereinafter also called fine marks) together with the pattern. The exposure apparatus 10 overlays and transfers the reticle pattern on the pattern formed in each shot area by the step-and-scan system. Therefore, in the present embodiment, to accurately overlay (align) the pattern and reticle pattern, the enhanced global alignment (EGA) is adopted of selecting at least three of the large number of shot areas as alignment shots, statistically processing the positional information obtained by detecting the fine marks (least square method etc.) for each alignment shot, and calculating the positional information of all of the shot areas to overlay and transfer the reticle pattern on the wafer.

To perform the EGA, after the first wafer stage 171 holds the wafer 32, the control syst 210 moves the first wafer stage 171 through the stage drive system based on the existing positional information (design positions etc.) relating to the search marks so that the marks for search alignment formed on the wafer 32 (hereinafter also called "search marks") are detected by the second alignment system 152 to move the search marks to the inside of the detection area of the second alignment system 152. Further, the positional information of the search marks detected at the second alignment system 152 (coordinate values of alignment coordinate system explained above) is sent to the control system 210, and the control system 210 moves the first wafer stage 171 through the stage drive system based on the positional information of the search marks detected and known positional information (design positions etc.) relating to at least three shot areas (or fine marks) selected as alignment shots on the wafer 32. Due to this, the fine marks are arranged in the detection area of the second alignment system 152 for each alignment shot of the wafer 32.

Next, the second alignment the system 152 detects the plurality of fine marks to find the positional information, the results of detection are transmitted to the control system 210 together with the measured values of the first interferometer system (positional information of first wafer stage 171 in alignment coordinate system), and the control system 210 uses the offset value of the second alignment system 152 stored in the second offset storage unit 212 to determine the positional information (coordinate values of alignment coordinate system) for each fine mark. Further, the control system 210 calculates the positional information of all of the shot areas on the wafer 32 based on the determined plurality of positional information using the EGA system. At this time, before detection of the fine marks or after detection, the second alignment system 152 is used to detect the fiducial marks provided at the first wafer stage 171 to find the positional information. Due to this, the positional relationship between the shot areas on the wafer 32 and fiducial marks in the alignment coordinate system defined by the first interferometer system is found, while the control system 210 stores the positional relationship in the storage unit and ends the fine alignment.

After the fine marks of the wafer 32 of the second alignment system 152 and the fiducial marks of the first wafer stage are detected, the control system 210 moves the first wafer stage 171 from the alignment position to the exposure position that the fiducial marks of the first wafer stage 171 are detected by the first alignment system 151. Further, the first alignment system 151 detects the fiducial marks and finds the positional information, the positional information is transmitted to the control system 210 together with the measured values ok the second interferometer system (positional information of the first wafer stage 171 in the exposure coordinate system), and the control system 210 finds the positional information (coordinate values) of the fiducial marks in the exposure coordinate system.

Further, the control system 210 determines the positional information (coordinate values) at the exposure coordinate system for each shot area based on the positional information of the fiducial marks and the positional relationship between the shot areas of the wafer 32 and fiducial marks stored previously in the storage unit. Further, based on the determined positional information and base line amount of the first alignment system 151, the control system 210 uses the measured values of the second interferometer system to move the first wafer stage 171 and overlays and transfers the pattern of the reticle 35 on the shot areas of the wafer 32 b the step-and-scan system. At this time, the positional information of the surface is detected for each shot area by a not shown autofocus sensor, the ZL stage 175 is driven based on the positional information, and the image plane of the projection optical system 142 and the surface of the shot area are brought into substantial register in the exposure area during the scan exposure. Due to this, the wafer 32 finishes being exposed. The control system 210 moves the first wafer stage 171 from the exposure position to the wafer load/unload position.

While the first wafer 32 its carried on the first wafer stage 171 and, as explained above, is being used for the search alignment, fine alignment, and exposure, the wafer loader 200 takes out the wafer 31 (33) stored at the next position adjoining the wafer 32 processed by the second processing system 22 of the CMP system 20, from the wafer cassette 30, conveys it to the second wafer stage 172 moved to the not shown predetermined wafer load/unload position, and places the wafer 33 on the wafer holder 178. The carried wafer 33 to firmly held on the wafer holder 178 by the vacuum suction holding force acting on the wafer holder 178.

After the second wafer stage 172 holds the wafer 33, the control system 210 moves the second wafer stage 172, detects the search marks of the wafer 33 at the third alignment system 153, and finds the positional information. Further, the control system 210 moves the second wafer stage 172 based on the positional information of the search marks and known positional information relating to the at least three shot areas (or fine marks) selected as alignment shots on the wafer 33 and arranges the fine marks in the detection area of the third alignment system 153 for each alignment shot of the wafer 33.

Next, the third alignment system 153 detects the plurality of fine marks to find their positional information, the results of detection are transmitted to the control system 210 together with the measured values of the first interferometer system, and the control system 210 uses the offset value of the third alignment system 153 stored in the second offset storage unit 213 to determine the position information (coordinate values at alignment coordinate system) for each fine mark. Further, the control system 210 uses the EGA system to calculate the positional information of all shot areas on the wafer 33 based on the determined plurality of positional information. At this time, it uses the third alignment system 153 to detect the fiducial marks provided at the second wafer stage 172 and find the positional information and finds the positional relationship between the shot areas on the wafer 33 and fiducial marks in the alignment coordinate system defined by the first interferometer system, and the control system 210 stores the positional relationship in the storage unit and ends the fine alignment. Note that in the present embodiment, as shown in FIG. 2, the alignment procedures for the wafer 33 is performed substantially in parallel with the exposure of the wafer 32.

Further, after the wafer 32 held at the first wafer stage 171 finishes being exposed, the control system 210 moves the first wafer stage 171 from the exposure position to the wafer load/unload position, then moves the second wafer stage 172 from the alignment position to the exposure position and detects the fiducial marks of the second wafer stage 172 by the first alignment system 151. Further, the first alignment system 151 detects the fiducial marks and finds the positional Information, the positional information is sent to the control system 210 together with the measured values of the second interferometer system (positional information of second wafer stage 172 in the exposure coordinate system), and the control system 210 finds the positional information (coordinate values) of the fiducial marks in the exposure coordinate system.

Further, the control system 210 determines the positional information (coordinate values) at the exposure coordinate system for each shot area based on the positional information of the fiducial marks and the positional relationship between the shot areas of the wafer 33 and fiducial marks stored at the storage unit previously. Further, based on the positional information determined and the base line amount of the first alignment system 151, the control system 210 uses the calculated value of the second interferometer system and moves the second wafer stage 172 and overlays and transfers the pattern of the reticle 35 on the shot areas on the wafer 33 by the step-and-scan system. At this time, the ZL stage 176 is driven based on the results of detection of the above autofocus sensor so that the image plane of the projection optical system 142 and the surface of the shot area substantially register in the exposure area during scan exposure. Due to this, the wafer 33 finishes being exposed. The control system 210 moves the second wafer stage 172 from the exposure position to the wafer load/unload position.

On the other hand, at the first wafer stage 171 moved to the wafer load/unload position, the wafers are exchanged, the exposed wafer 32 in unloaded, and the next wafer taken out from the wafer cassette 30 is loaded. At this time, the wafer loader 200 stores the unloaded wafer 32 at the original position of the wafer cassette 30 or a predetermined position of another wafer cassette different from the wafer cassette 30, for example, the same position as the storage position at the wafer cassette 30. Further, the wafer loader 200 loads the third wafer stored at the next position adjoining the wafer 33, processed at the first processing system 21 of the CMP system 20 to the first wafer stage 171 as the next wafer (second wafer 32).

Figure 4:
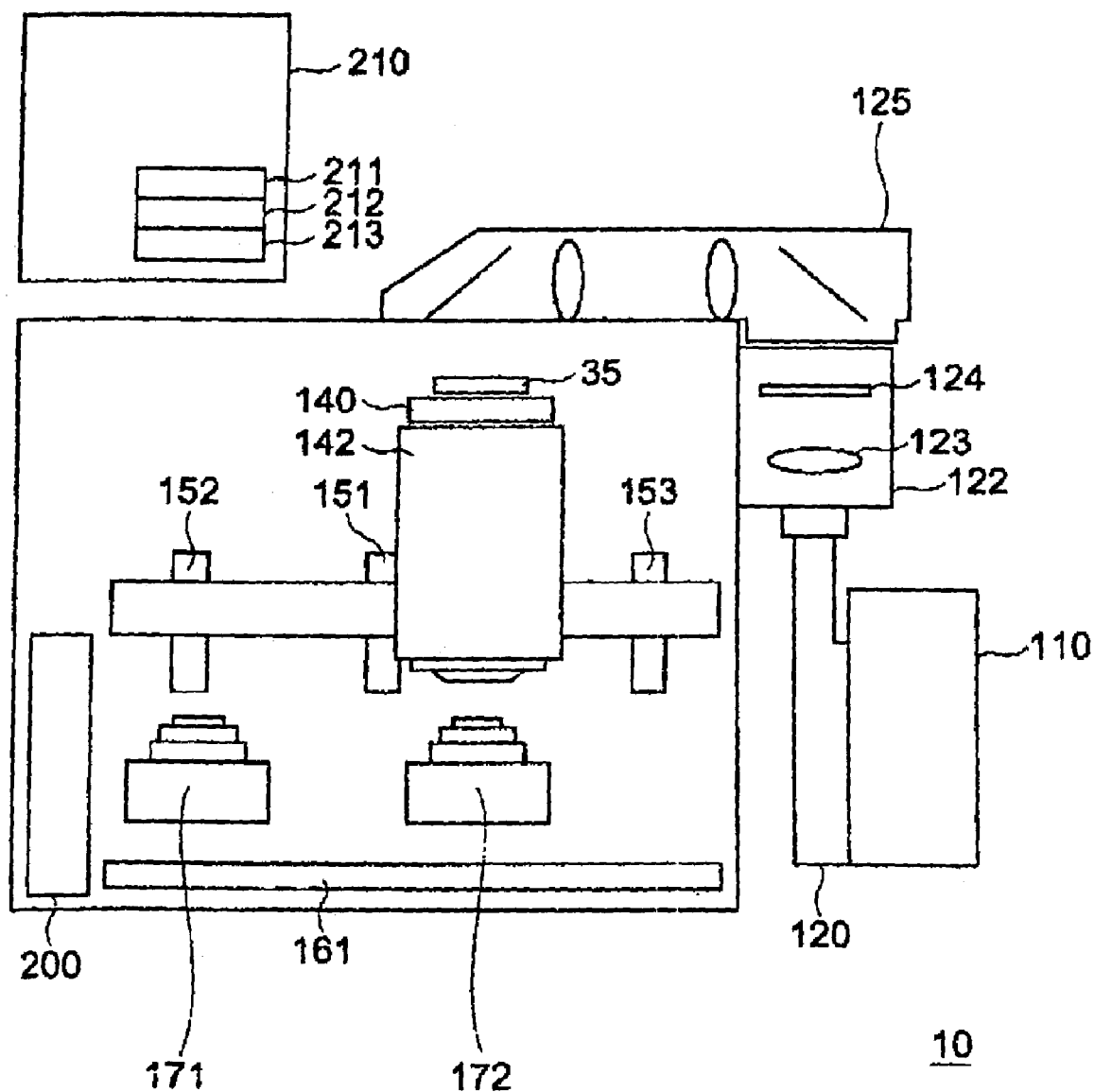
FIG. 4 is a view of the state of a wafer carried on a second wafer stage being exposed in the exposure apparatus shown in FIG. 2.

Further, after the wafers finish being exchanged, the control system 210 moves the first wafer stage 171 to the alignment position, detects the search marks and plurality of fine marks of the second wafer 32 held at the first wafer stage 171 and the fiducial marks of the first wafer stage at the second alignment system 152 by exactly the same operation as the above wafer 32, calculates the positional information for each shot area by the EGA system, and stores the positional relationship between the shot areas and the fiducial marks in the storage unit. Note that in the present embodiment, as shown in FIG. 4, the exchange and the alignment procedures of the wafer 32 are performed substantially in parallel with the exposure of the wafer 33.

Next, after the wafer 33 held at the second wafer stage 172 finishes being exposed, the control system 210 moves the second wafer stage 172 from the exposure position to the wafer load/unload position, then moves the first wafer stage 171 from the alignment position to the exposure position and detects the fiducial marks of the first wafer stage 171 by the first alignment system 151 and the exposure of the second wafer 32 by exactly the same operation as the first wafer 32. Further, after the second wafer 32 finishes being exposed, the control system 210 moves the first wafer stage 171 from the exposure position to the wafer load/unload position.

On the other hand, at the second wafer stage 172 moved to the wafer load/unload position, the wafers are exchanged, the exposed wafer 33 is unloaded, and the next wafer taken out from the wafer cassette 30 is loaded. At this time, the wafer loader 200 stores the unloaded wafer at its original position in the wafer cassette 30 or a predetermined position of another wafer cassette, for example, the same position as the storage position in the wafer cassette 30. Further, the wafer loader 200 loads a fourth wafer, stored at the next position in the wafer cassette 30 alongside the second wafer 32 to the second wafer stage 172 as the next wafer (second wafer 33).

Further, the control system 210 moves the second wafer stage 172 to the alignment position after the wafers finish being exchanged, the search marks and plurality of fine marks of the second wafer 33 held at the second wafer stage 172 and fiducial marks of the second wafer stage 172 are detected by the third alignment system 153, the positional information is calculated for each shot area by the EGA system, and the positional relationship between the shot areas and the fiducial marks is stored in the storage unit. Note that the exchange and the alignment procedures of the wafers 33 are performed substantially in parallel with the exposure of the second wafer 32.

Next, after the second wafer 32 held at the first wafer stage 171 finishes being exposed, the control system 210 move the first wafer stage 171 from the exposure position to the wafer load/unload position, then moves the second wafer stage 172 from the alignment position to the exposure position and detects the fiducial marks of the second wafer stage 172 by the first alignment system 151 and exposes the second wafer 33 by the exact same operation as the above-mentioned first wafer 33. Substantially in parallel with the exposure of the second wafer 33, the first wafer stage 171 exchange wafers and performs the alignment procedures (detects marks by the second alignment system 152).

Further, after the second wafer 32 finishes being exposed, the control system 210 moves the second wafer stage 172 from the exposure position to the wafer load/unload position, than moves the first wafer stage 171 from the alignment position to the exposure position and detects the fiducial marks of the first wafer stage 171 and exposes the third wafer 32 by the exact same way. After this, the above operation is repeatedly executed until all of the wafers in the same lot (in this example, the cassette 30) finish being used. That is, the first wafer stage 171 and the second wafer stage 172 are alternately arranged at the exposure position and substantially in parallel with the exposure of the wafer held at one wafer stage, the other wafer stage exchanges wafers and performs the alignment procedures.

Figure 5:
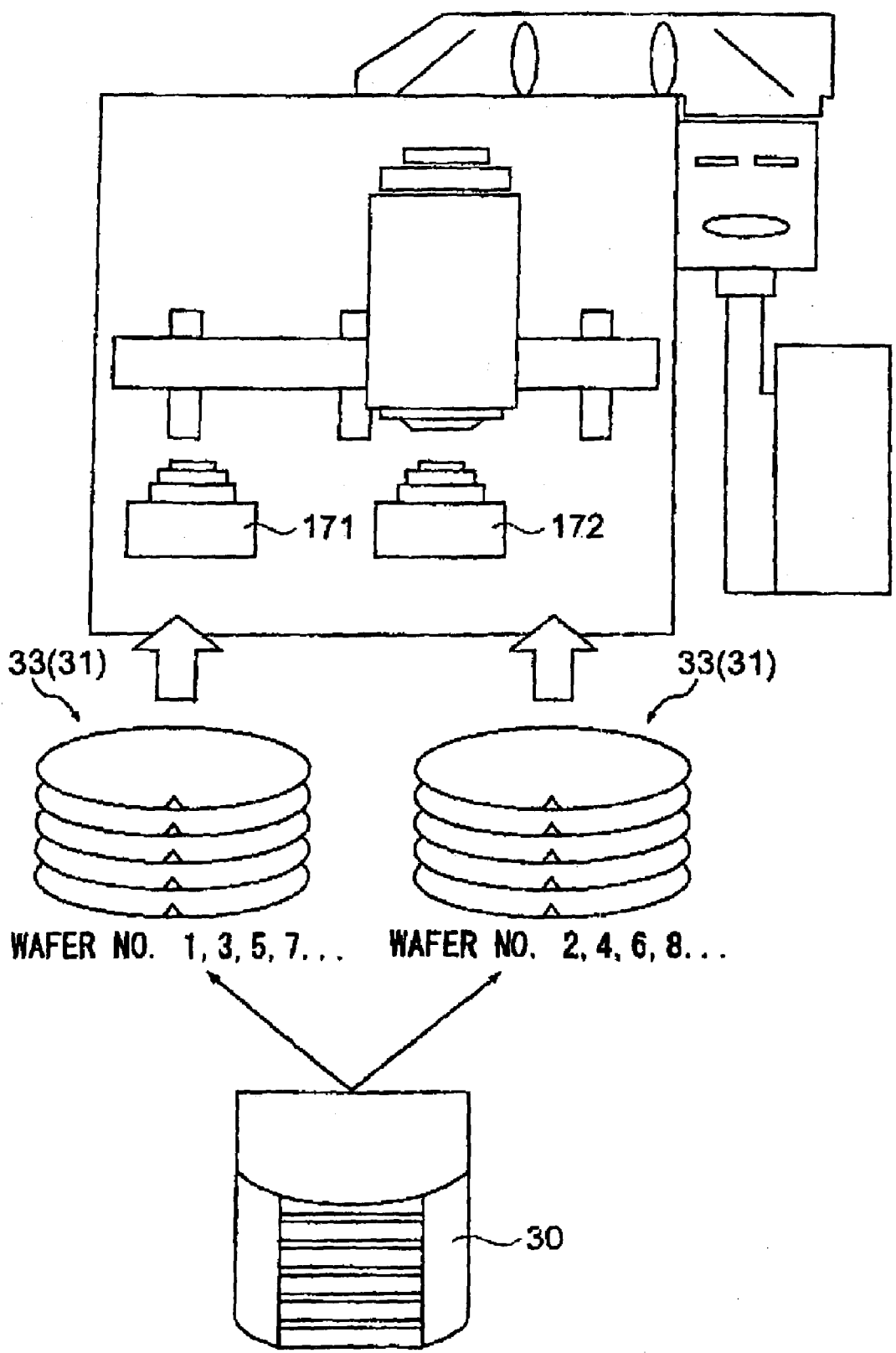
FIG. 5 is a view of the operation where a series of wafers are processed in the exposure apparatus shown in FIG. 2.

As a result, among the series of wafers 31 stored in the wafer cassette 30, as shown in FIG. 5, the odd numbered wafers 31 (32) are placed on the first wafer sa 171 and aligned (fine marks etc. detected) by the second alignment system 152, then are moved to the above-mentioned exposure position and exposed. On the other hand, the even numbered wafers 31 (32) are placed on the second wafer stage 172 and aligned (fine marks etc. detected) by the second alignment system 153, then a similarly moved to the above-mentioned exposure position and exposed.

In this way, in the semiconductor integrated circuit production line 1 of the present embodiment, the CMP system 20 and exposure apparatus 10 each have two processing systems 21 and 22, and 11 and 12 respectively, so can efficiently perform the CMP and exposure on a series of wafers 31 in a short time.

Further, at this time, the wafers processed by the same processing system 21 or 22 of the CMP system 20 are processed by the same processing system 11 or 12 in the exposure apparatus 10 as well, more specifically by the same wafer stage and alignment system.

Therefore, the error of the first processing system 11 of the exposure apparatus 10, that is, the processing unit including the first wafer stage 171 and second alignment system 152, has an effect on only the overlay accuracy of the wafers processed by the first processing system 21 of the CMP system 20, that is, processed in one chamber. Further, the error of the second processing system 12 of the exposure apparatus 10, that is, the processing unit including the second wafer stage 172 and third alignment system 153, has an affect on only the overlay accuracy of the wafers processed by the second processing system of the CMP system 20, that is, processed in the other chamber. Therefore, it is possible to avoid the overlay error from greatly deteriorating by random accumulation of error among units of tho plurality of processing system of the exposure apparatus 10 in addition to the process error in the CMP system 20.

Further, in the semiconductor integrated circuit production line 1 of the present embodiment, the correspondence between the process error of the processings and the error of the processing units of the processing systems becomes clear, so processing becomes easy when correcting this later or allocating wafers so that process error and error between units do not accumulate in a later processing apparatus designed for multiprocessing.

For example, the error of the first processing system 11 of the exposure apparatus 10, the error at the first processing system 21 of the CMP system 20, or the error of the two combined can be detected and grasped by a certain degree of accuracy. The error of the first processing system 11 of the exposure apparatus 10 is error peculiar to the processing unit including the first wafer stage 171 and the second alignment system 152. The error in the first processing system 21 of the system 20 is process error peculiar to wafers processed in one chamber. Further, the error of the second processing system 12 of the exposure apparatus 10, the error of the second processing system of the CMP system 20, or the error of the two combined may be detected and grasped by a certain degree of accuracy. The error of the second processing system 12 of the exposure apparatus 10 is error peculiar to the processing unit including the second wafer stage 172 and the third alignment system 153. The error in the second processing system of the CMP system 20 is process error peculiar to wafers processed in the other chamber.

Therefore, by correcting these errors at the time of exposure at the exposure apparatus 10, it is possible to correct these errors and improve the overlay accuracy.

That is, by preparing a first offset value corresponding to the first processing system 11 of the exposure apparatus 10 and a second offset value corresponding to the second processing system 12 of the exposure apparatus 10 based on these error information, and using these offset values for exposure of a series of wafers, a predetermined pattern in transferred at a high accuracy in the same way to both wafers processed by the first processing system 11 and wafers processed by the second processing system 12.

In the present embodiment, however, before the exposure of a wafer, the first alignment system 151 detected the fiducial marks of the wafer stages 171 or 172, but instead of the fiducial marks, it is also possible for example to detect alignment marks (fine marks or search marks) of the wafer. In this case, however, it is desired to use the offset value of the first alignment system 151 stored in the first offset storage unit 211 of the control system 210 to find the positional information of the marks detected instead of the fiducial marks. At this time, it is desirable to prepare the offset values separately for the wafers (32) processed by the first processing system of the processing apparatus 20 and the wafers (33) processed by the second processing system.

Further, in the present embodiment, both search alignment and fine alignment are performed, that is, both the search marks and fine marks are detected, but it is also possible not to perform the search alignment (detect the search marks) and to perform just the fine alignment (detect the fine marks). Note that sometimes the search marks are not detected and fine marks are not arranged in the detection area of the alignment system 152 or 153 even if moving the wafer stage based on the existing positional information (design position etc.) relating to the alignment shots on the wafer (fine marks). In this case, for example, it is possible to make the observation power of the alignment system a low power and detect a wide range and to find fine marks, return to the high power and then perform the detection. Alternatively, it is possible to optically detect a plurality of locations on the outer edge of the wafer at the wafer load/unload position, correct the positional error of the wafer, then pick up the wafer by suction by the wafer holder or add the detected positions error to the above-mentioned existing positional information and move the wafer stage.

Further, in the present embodiment, in parallel with the exposure of the wafer held by one of the first and second wafer stages 171 and 172, wafer alignment procedure (mark detection) is performed in the other wafer stage. For example, however, it is also possible to provide the second and third alignment systems 152 and 153 with optical sensors (for example, above-mentioned auto focus sensors etc.) for detecting the surface position (height information) of the wafers and detect the step difference information of the wafer (shot areas) in parallel with the exposure. That is, the information to be detected in parallel with the exposure is not limited in number or type to those of the above embodiments.

Further, in the present embodiment, the wafers processed by the processing apparatus 20 are stored in the wafer cassette 30 in lot units and loaded into the exposure apparatus 10, but it is also possible to load then into the exposure apparatus 10 in wafer sits. Specifically, at least part of the processing apparatus 20 (for example, including the film forming system, resist coater, developer, etc., hereinafter called simply a coater-developer) may be connected in-line to the exposure apparatus 10 and the processed wafers may be loaded in the exposure apparatus 10 using at least one of the conveyance mechanism of the coater-developer (movable type robot arm etc.) and above-mentioned wafer loader 200. With this configuration, the loading position of the wafer in the exposure apparatus 10 becomes the above first position. At this time, the wafer loader 200 loads a wafer to the wafer stage at the wafer load/unload position (second position) and picks up an exposed wafer from the wafer stage at the second position, conveys it to the first position (or unloading position different from the first position), and transfers the wafer to a coater-developer (conveyance mechanism) there. Note that the cassette may be placed at the loading position (and/or unloading position) in the exposure apparatus 10 or in the middle of the conveyance path linking the loading position (and/or unloading position) and the above-mentioned second position and store the wafers temporarily in the cassette. Here, the position where the cassette is placed at the loading position or in the middle of the loading path may also be made the above first position. This configuration is effective in adjusting the cycle time when there is a difference in the processing capabilities (numbers of wafers processed per unit time) between the processing apparatus 20 and the exposure apparatus 10.

Note that the present embodiment was described to facilitate understanding of the present invention and does not limit the present invention in may way. The elements disclosed in the present embodiment include all design changes or equivalents falling in the technical range of the present invention and can be modified in various suitable ways as desired.

For example, the exposure apparatus 10 according to the present invention in the above embodiment forms a first processing system 11 by combining the first wafer stage 171, second alignment system 152, and second offset storage unit 212 and forms a second processing system 12 by combining a second wafer stage 172, third alignment system 153, and third offset storage unit 213 and allocates wafers to the first processing system 11 and second processing system 12 for exposure. That is, in the exposure apparatus 10 having the configuration shown in FIG. 2, a plurality of the three components of the wafer stage, alignment system, and alignment offset storage unit are provided and used together with the processing systems.

The configurations of the processing systems of the exposure apparatus 10 are not limited to such a configuration. It is also possible to provide a plurality of any two or any one component among the three components of the wafer stage, alignment system, and alignment offset storage unit and form each as a processing system.

Further, the processing systems of the exposure apparatus 10 are not limited in types of components to the wafer stages, alignment systems, and alignment offset storage units and may be any components. It is also possible to provide other configurations, for example, the above-mentioned first interferometer system, instead of at least one of the three components.

Figure 6:
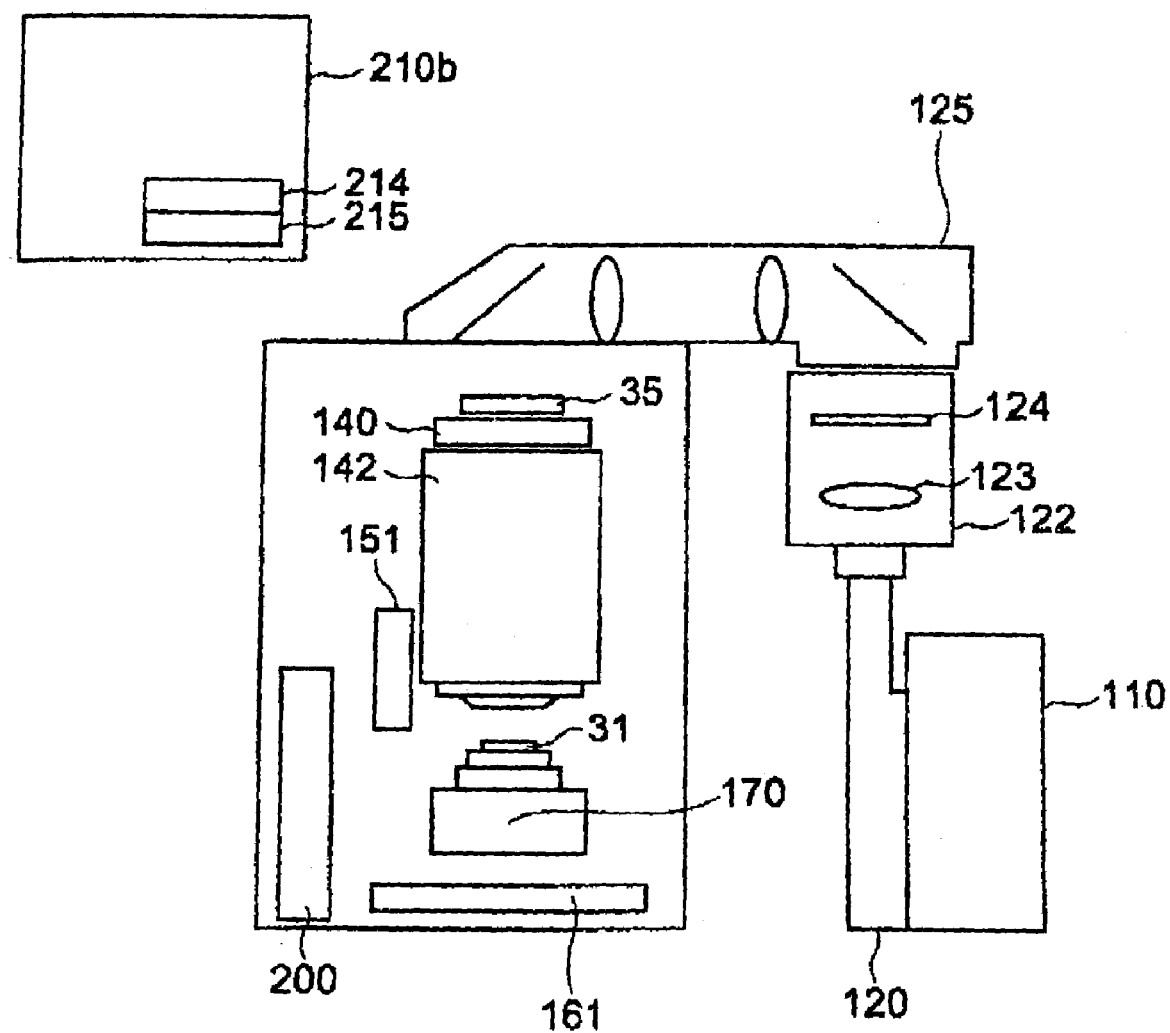
FIG. 6 is a view of the configuration of another exposure apparatus of the present invention able to be used for the semiconductor integrated circuit production line shown in FIG. 1.

One example of another exposure apparatus of a configuration different from the exposure apparatus 10 shown in FIG. 2 is shown in FIG. 6. Note that in the exposure apparatus 10b shown in FIG. 6, components assigned the same reference numerals as in the exposure apparatus 10 shown in FIG. 2 have the a functions and perform the same operations as the corresponding components of the exposure apparatus 10 shown in FIG;. 2 explained previously.

The exposure apparatus 10b shown in FIG. 6 is only provided with one alignment system and wafer stage each. This exposure apparatus is designed for multiprocessing and for successively processing wafers one by one.

In the exposure apparatus 10b, however, the control system 210b has two alignment offset storage units 214 and 215 and can separately store different alignment offset values. Therefore, it is possible to perform two systems of alignment processing by viewing one of the alignment offsets stored in the two alignment offset storage units 214 and 215 with respect to the positions of fiducial marks or alignment marks on the wafer stage 170 or wafer 31 detected in the alignment system 150.

That is, the exposure apparatus 10b is configured having two processing systems including a first processing system for alignment processing by referring to the alignment offset stored at the first alignment offset storage unit 214 and the second processing system for alignment processing by referring to the alignment offset stored at the second alignment offset storage unit 215.

Further, in the same way as for example the above-mentioned embodiment, when processing wafers processed by the CMP system 20 having two processing systems, in the exposure apparatus 10b, based on the control of the control system 210b, the alignment for the wafer processed by the first processing system 21 of the CMP system 20 is performed by referring to the alignment offset stored in the first processing system of the exposure apparatus 10, that is, the alignment offset storage unit 214, and the alignment for the wafer processed by the second processing system 22 of the CMP system 20 in performed by referring to the alignment offset stored in the second processing system of the exposure apparatus 10, that is, the alignment offset storage unit 215.

This exposure apparatus 10b can perform alignment corresponding to the process error, that is, corresponding to the processing system of the CMP system 20, by storing the alignment offsets corresponding to specific process errors for each processing system of the CMP system 20 in the alignment offset storage units 214 and 215.

When performing the CMP processing at the CMP system 20 designed for multiprocessing, a plurality of process error corresponding to the processing systems occurs to the processed wafers. When processing these wafers by a single processing system or when processing these wafers without any cooperation by a processing apparatus having a plurality of processing systems, the process error grows (becomes more dispersed) or accumulates.

In the exposure apparatus 10b shown in FIG. 6, it is possible to perform the alignment using an average offset values determined based on the plurality of process errors. However, by performing the alignment using a processing system designed for each process error and/or an offset value corresponding to each process error, it is possible to suppress the dispersion or accumulation of such process error and possible to prevent the overlay accuracy and positioning accuracy for each process from greatly deteriorating. As a result, it is possible to produce a high quality semiconductor chip by a high throughput.

In this way, the exposure apparatus 10 of the configuration illustrated in FIG. 6 is in the range of the present invention.

Further, conversely from the configuration as shown in FIG. 6, the exposure apparatus 10 may also be configured to have three or more of each of the wafer stage, alignment system, and alignment offset storage unit.

Further, the method of transmitting processing information showing by which of the processing systems of the wafer processing apparatus 20 each wafer is processed from the wafer processing apparatus to the exposure apparatus 10 is not limited to the method of going through the communications line 40 connecting the processing apparatuses of the semiconductor integrated circuit production line 1 shown in FIG. 1.

Figure 7:
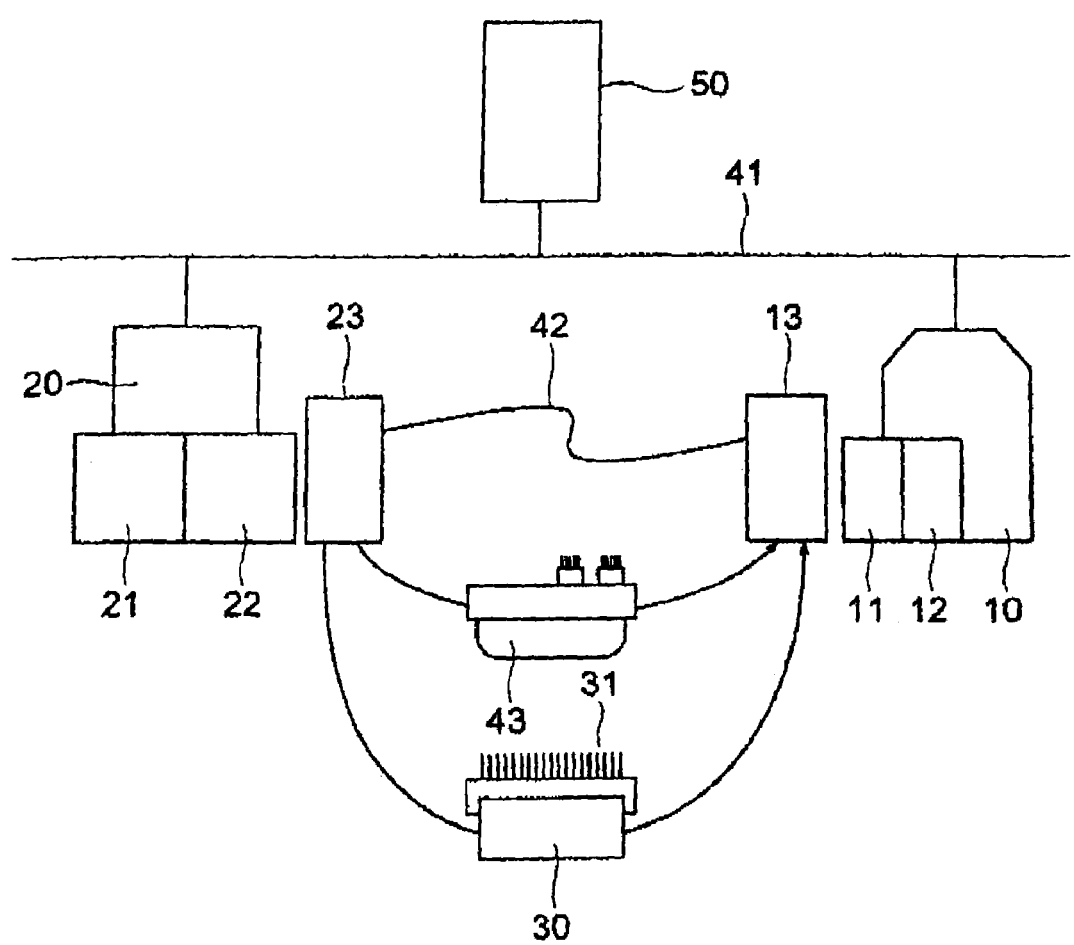
FIG. 7 is a view of a modification of information unit between a wafer processing apparatus and exposure apparatus in the semiconductor integrated circuit production line shown in FIG. 1.

Various specific embodiments will be explained with reference to FIG. 7.

Further, when the entire semiconductor integrated circuit production line 1 is managed by a host computer 50 connected by a network 41, the wafer processing information of the lot processed in the wafer processing apparatus 20 is suitably of a type stored once and managed at the host computer 50 through the network 41. In this case, when processing a lot at the exposure apparatus 10, the exposure apparatus 10 acquires the wafer processing information of the corresponding lot from the host computer 50 and determines the processing system for processing the wafers based on this acquired information.

With this embodiment, when selectively transmitting wafer processing information to a plurality of processing apparatus where the lot to processed, control of the transmission of information is easy and suitable. Further, when determining the allocation of wafers at the next step considering the systems, types, state of accumulation, etc. of processor error up until then for wafers resulting from passing through a plurality of processing apparatuses designed for multiprocessing, it is possible to perform the processing for detecting the systems, types, states of accumulation, etc. of the process error all together at the host computer 50.

Further, when the wafer processing apparatus 20 and exposure apparatus 10 are controlled by higher control computers 23, 13, it is also possible to directly connect the control computers 23 and 13 by a dedicated communications line 42 and transmit the wafer processing information.

Further, when for example the wafers processed by the wafer processing apparatus 20 are conveyed by an AGV 43 together with the entire wafer cassette 30 and loaded into the exposure apparatus 10, it is also possible to provide the AGV 43 with the function of temporarily storing information and convey wafer processing information through the information storage unit of the AGV 43 from the wafer processing apparatus 20 to the exposure apparatus 10.

Further, it is also possible not to convey special information, but to link the wafer stage positions (or wafer IDs etc.) In the wafer cassette 30 and the processing systems of the wafer processing apparatus 20 and use the wafer storage positions in the wafer cassettes 30 to actually convey wafer processing information to the exposure apparatus 10.

Further, in the semiconductor integrated circuit production line 1 of the present embodiment, the CMP system 20 and exposure apparatus 10 are apparatuses each having two processing systems. However, the invention is not limited to two systems. One or both of the apparatus may be configured to have three or more systems.

In this case, for example, the case may be considered where the CMP system 20 has three chambers and where the exposure apparatus 10 has two processing systems each having a wafer stage and an alignment sensor. In this case, for example, a wafer processed at the first chamber of the CMP system 20 is processed by the first processing system of the exposure apparatus 10, while a wafer processed by the second chamber of the CMP system 20 is processed by the second processing system of the exposure apparatus 10. A wafer processed by the third chamber of the CMP system 20 may be processed by one of the processing systems of the exposure apparatus 10. If later correction is possible, the wafer processed by the third chamber may be allocated to both of the first and second processing systems.

Even in the case where the numbers of the processing systems at preceding and foregoing processes do not match, for example, it is possible to deal with this case by allocating wafers in this way. Further, in such a case as well, compared with the case in which allocation of wafers is performed substantially randomly without any linkage, suitable processing can be performed while suitably maintaining both the overlay accuracy and throughput. Such a method is also within the scope of the present invention.

Further, in the exposure apparatus 10 of the present embodiment, the wafer load/unload position of the first wafer stage 171 and the wafer load/unload position of the second wafer stage 172 are made different, but they may also be the same position. In this case, it is necessary to control the stage drive system so that the first wafer stage 171 and the second wafer stage 172 do not contact and the configuration of the control system 210 becomes somewhat complicated, but in the wafer loader 200, a single wafer transfer location is sufficient and therefore the configuration can be much simpler.

Further, in the present embodiment, the multiprocessing performed at the wafer processing apparatus 20 before the exposure at the exposure apparatus 10 is made a CMP processing, but the invention is not limited to this. It is also possible to perform any processing performed before the exposure step in a semiconductor IC production line which controls the allocation of wafers to processing systems in this way in relation to the step of multiprocessing.

Further, in the present embodiment, it is assumed that multiprocessing is performed in a process before the exposure process, but sometimes the multiprocessing is performed by a process after the exposure process, for example, a development step. Therefore, it is also possible to process wafers exposed by the same processing system (11 or 12) of the exposure apparatus 10 (in other words, wafers passing through the same path in the exposure apparatus 10) by the same processing system of the development apparatus or other post-processing apparatus (separate processing system).

Further, even in the case of exposure using an exposure apparatus having a plurality of processing system for performing the same processing in a step before or a step after exposure by an exposure apparatus having a plurality of processing systems (11, 12) performing the same processing, it is possible to expose wafers exposed by the same processing system of the previous exposure apparatus by the same processing system of a later exposure apparatus.

Further, in the above embodiment, offset information (offset values) relating to alignment may include not only information relating to the positional error in the X-direction and Y-direction of shots on a wafer (shot offset), but also at least one of scaling error in the X-direction and Y-direction, rotational error or orthogonality error of wafers, magnification error in the X-direction and Y-direction of shots, and rotational error and orthogonality error of shots. Further, the offset information (offset values) stored in the offset storage unit is not limited to information relating to alignment. For example, it is also possible to store functional information relating to focus leveling information (information relating to the surface position of a wafer), that is, positional error in the Z-direction of the wafer surface or inclination error in the X-direction and Y-direction.

Further, in the present embodiment, the projection optical system 142 of the exposure apparatus 10 was made a reduction system, but it may also be an equal magnification system or an enlargement system. Further, it may be not only a refraction system, but also a catiodioptic system and a reflection system.

Further, in the present embodiment, the exposure apparatus 10 was made a so-called "scanner", but it may also be an exposure apparatus of the stepper and mirror projection system or proximity system etc.

The exposure illumination light of the exposure apparatus 10 is not limited to the light source 110 of the present embodiment. It may also be continuous light or light pulses. Further, it is also possible to use UV light, EUV light, X-rays, electron beams, ion beam, or other charged particle beams, etc.

Further, the object exposed by the exposure apparatus 10 also may be a semiconductor device, liquid crystal display elements, thin film magnetic head, CCD or other pickup elements, micromachine, DNA chip, or other micro device, plasma display, organic EL, or other display device, reticle, mask, etc.

Further, in the process of production of a device including a lithography step using the exposure apparatus 10 of FIG. 2, for example a semiconductor device is produced through a step of design of the functions and performance of the device, a step of fabrication of a reticle based on this design step, a step of fabrication of a wafer from a silicon material, a step of pretreatment of the wafer using a film forming systems, resist coater, etc., a step of exposure of a pattern of the reticle on to the wafer using an exposure apparatus of FIG. 2, a step of post-treatment of the wafer using the exposure apparatus, a step of assembly of the device (including dicing, bonding, and packaging), and a step of inspection.

In this way, according to the above embodiment, it is possible to produce a method of exposure by an exposure apparatus designed for multiprocessing having a plurality of substrate stages and other processing systems, which exposure method can prevent an extreme deterioration in the extent of overlay of accumulated process error when exposing a substrate being processed after processing by a processing apparatus designed for multiprocessing and therefore can produce high quality semiconductor chips by a high throughput.

Further, it is possible to provide an exposure apparatus designed for multiprocessing having a plurality of substrate stages and other processing systems, which exposure apparatus can prevent an extreme deterioration in the extent of overlay of accumulated process error when exposing a substrate being processed after processing by a processing apparatus designed for multiprocessing and therefore can produce high quality semiconductor chips by a high throughput.

Further, according to the above embodiments, it is possible to provide an exposure method and apparatus able to detect with a good precision the positional information of a plurality of substrates after going through a processing apparatus performing the same processing by a plurality of processing systems.

Further, it is possible to provide a method of production of a device enabling a micro device to be produced with a high precision and high throughput.

The entire content of the disclosure of Japanese Patent Application No. 2002-132996, filed on May 8, 2002, and Japanese Patent Application No. 2003-101133, filed on Apr. 4, 2003, including the specification, claims, drawings, and abstract, is expressly incorporated herein by reference in its entirety.

What is claimed is:

1. A exposure method for exposing a sensitive substrate by an exposure apparatus having a plurality of processing systems to transfer a pattern on a mask to said sensitive substrate, wherein:
    when exposing a series of sensitive substrates subjected to predetermined processing by a processing apparatus having a plurality of processing systems before exposure, said series of sensitive substrates are allocated to said plurality of processing systems of said exposure apparatus and exposed so that the sensitive substrates processed by the same processing system of said processing apparatus are processed at the same processing system of said plurality of processing systems of said exposure apparatus.

2. An exposure method according to claim 1, wherein:
    the plurality of processing systems of said exposure apparatus have a plurality of substrate stages, and the sensitive substrates processed by the same processing system of said processing apparatus are loaded at the same substrate stage of said plurality of substrate stages and then exposed.

3. An exposure method according to claim 2, wherein:
the plurality of processing systems of said exposure apparatus have a plurality of alignment sensors, and
the sensitive substrates processed by the same processing system of said processing apparatus are aligned using the same alignment sensor among said plurality of alignment sensors and then exposed.

4. An exposure method according to claim 2, wherein:
said exposure apparatus has an alignment unit for alignment using one of a plurality of alignment offsets, and
an alignment offset is set to the sensitive substrates processed by the same processing system of said processing apparatus, and the sensitive substrates processed by the same processing system are aligned using said alignment offset.

5. An exposure method according to claim 2, wherein the method:
acquires information showing which of the processing systems of said processing apparatus each of the sensitive substrates was processed, and
allocates the sensitive substrates based on said acquired information.

6. An exposure method according to claim 5, wherein the method acquires said information by receiving information from an outside apparatus.

7. An exposure method according to claim 5, wherein the method acquires said information based on storage positions of said sensitive substrates in a cassette storing said series of sensitive substrates.

8. An exposure method according to claim 1, wherein
said exposure apparatus has a first processing system and a second processing system, and wherein the method
alternately allocates and exposes said series of sensitive substrates processed at said plurality of processing systems of said processing apparatus and stored in a cassette to said first processing system and said second processing system.

9. An exposure method for successively exposing a plurality of sensitive substrates by an exposure apparatus having a first substrate stage and a second substrate stage, the exposure method comprising:
selectively loading said plurality of sensitive substrates at either of said first and second substrate stages based on information showing a processing history of each of said plurality of sensitive substrates;
wherein one of the plurality of sensitive substrates loaded on the first substrate stage is exposed with an exposure beam by an optical system, and another sensitive substrate loaded on the second substrate stage is exposed with the exposure beam by the optical system.

10. An exposure method according to claim 9, wherein each of said plurality of sensitive substrates is exposed based on offset information in accordance with said processing history.

11. An exposure method according to claim 10, wherein said offset information includes first offset information and second offset information, the sensitive substrates loaded at said first substrate stage are exposed using said first offset information, and the sensitive substrates loaded at said second substrate stage are exposed using said second offset information.

12. An exposure method according to claim 10, wherein said offset information includes at least one of alignment information and focus information.

13. An exposure method according to claim 9, wherein:
said plurality of sensitive substrates are loaded into said exposure apparatus through a processing apparatus having a first processing system and a second processing system performing the same processing, and
said processing history includes an indication of said first and second processing systems at which the respective sensitive substrates were processed.

14. A device manufacturing method including a step of transferring a device pattern to a sensitive substrate using an exposure method according to claim 1.

15. An exposure method according to claim 9, wherein the optical system includes a projection optical system by which a pattern image is projected onto each of the plurality of sensitive substrates successively.

16. An exposure method according to claim 9, wherein one portion of the plurality of sensitive substrates, which has been processed by a first processing system, is loaded to the first substrate stage, and another portion of the plurality of sensitive substrates, which has been processed by a second processing system, is loaded to the second substrate stage.

17. An exposure method according to claim 16, wherein the first and second substrate stages have respective process characteristics.

18. An exposure method according to claim 17, wherein the first and second processing systems have respective process characteristics.

19. An exposure method according to claim 18, wherein each of the first and second processing systems performs a polishing process.

20. An exposure method according to claim 16, wherein the plurality of sensitive substrates are included in one lot.

21. An exposure method according to claim 20, wherein the first and second substrate stages are movable independently over a common base.

22. A device manufacturing method including a step of forming a device pattern on a sensitive substrate using an exposure method according to claim 9.

23. An exposure method for successively exposing a plurality of sensitive substrates by an exposure apparatus having a first substrate stage, a second substrate stage, and a common optical system that exposes sensitive substrates loaded on the first substrate stage when the first substrate stage is disposed at an exposure position and that exposes sensitive substrates loaded on the second substrate stage when the second substrate stage is disposed at the exposure position, the exposure method comprising:
loading a first group of the plurality of sensitive substrates onto the first substrate stage based on a determination that the first group has been processed by a first processing system; and
loading a second group of the plurality of sensitive substrates onto the second substrate stage based on a determination that the second group has been processed by a second processing system that is different from the first processing system but that performs a same processing as the first processing system.

24. An exposure method according to claim 23, wherein the common optical system includes a projection optical system by which a pattern image is projected onto each of the plurality of sensitive substrates successively.

25. An exposure method according to claim 23, wherein the first and second substrate stages have respective process characteristics.

26. An exposure method according to claim 23, wherein the first and second processing systems have respective process characteristics.

27. An exposure method according to claim 23, wherein each of the first and second processing systems performs a polishing process.

28. An exposure method according to claim 23, wherein the plurality of sensitive substrates are included in one lot.

29. An exposure method according to claim 23, wherein the first and second substrate stages are movable independently over a common base.

30. A device manufacturing method including a step of forming a device pattern on a sensitive substrate using an exposure method according to claim 23.

* * * * *